(12) United States Patent
Aratake

(10) Patent No.: US 8,427,250 B2
(45) Date of Patent: Apr. 23, 2013

(54) PIEZOELECTRIC VIBRATOR MANUFACTURING METHOD, PIEZOELECTRIC VIBRATOR, OSCILLATOR, ELECTRONIC DEVICE, AND RADIO-CONTROLLED TIMEPIECE

(75) Inventor: Kiyoshi Aratake, Chiba (JP)

(73) Assignee: Seiko Instruments Inc., Chiba (JP)

( * ) Notice: Subject to any disclaimer, the term of this patent is extended or adjusted under 35 U.S.C. 154(b) by 231 days.

(21) Appl. No.: 13/112,570

(22) Filed: May 20, 2011

(65) Prior Publication Data

US 2011/0221537 A1    Sep. 15, 2011

Related U.S. Application Data

(63) Continuation of application No. PCT/JP2008/071645, filed on Nov. 28, 2008.

(51) Int. Cl.
*H03B 5/32* (2006.01)
*H01L 41/053* (2006.01)

(52) U.S. Cl.
USPC .......................... 331/156; 331/158; 331/68

(58) Field of Classification Search .......... 331/158, 331/156, 68
See application file for complete search history.

(56) References Cited

U.S. PATENT DOCUMENTS

2010/0320872 A1* 12/2010 Numata et al. ............. 310/344
2010/0320877 A1* 12/2010 Onitsuka et al. ............. 310/365

FOREIGN PATENT DOCUMENTS

| JP | 06-283951 A | 10/1994 |
| JP | 2002-124845 A | 4/2002 |
| JP | 2002-319839 A | 10/2002 |
| JP | 2003-204240 A | 7/2003 |
| JP | 2003-209198 A | 7/2003 |
| JP | 2004-166006 A | 6/2004 |
| JP | 2004-254238 A | 9/2004 |
| JP | 2006-196932 A | 7/2006 |
| JP | 2008-098909 A | 4/2008 |
| JP | 2008-211570 A | 9/2008 |

OTHER PUBLICATIONS

International Search Report for International Application No. PCT/JP2008/071645, dated Jan. 27, 2009, 2 pages.

* cited by examiner

*Primary Examiner* — Joseph Chang
(74) *Attorney, Agent, or Firm* — Brinks Hofer Gilson & Lione

(57) ABSTRACT

The piezoelectric vibrator includes: a package in which a first substrate and a second substrate are superimposed so as to form a cavity therebetween; outer electrodes which are formed on an outer surface of the first substrate; inner electrodes which are formed on the first substrate so as to be accommodated in the cavity; penetration electrodes which are formed so as to penetrate through the first substrate so that the outer electrodes and the inner electrodes are electrically connected; and a piezoelectric vibrating reed which is sealed in the cavity and electrically connected to the inner electrodes at the inner side of the cavity. The first substrate and the second substrate are bonded by a bonding film that is formed of a low-melting-point glass, and the bonding film is heated to a predetermined bonding temperature when the first substrate and the second substrate are bonded together, and is formed by being heated to a temperature higher than the bonding temperature before the bonding is performed.

8 Claims, 16 Drawing Sheets

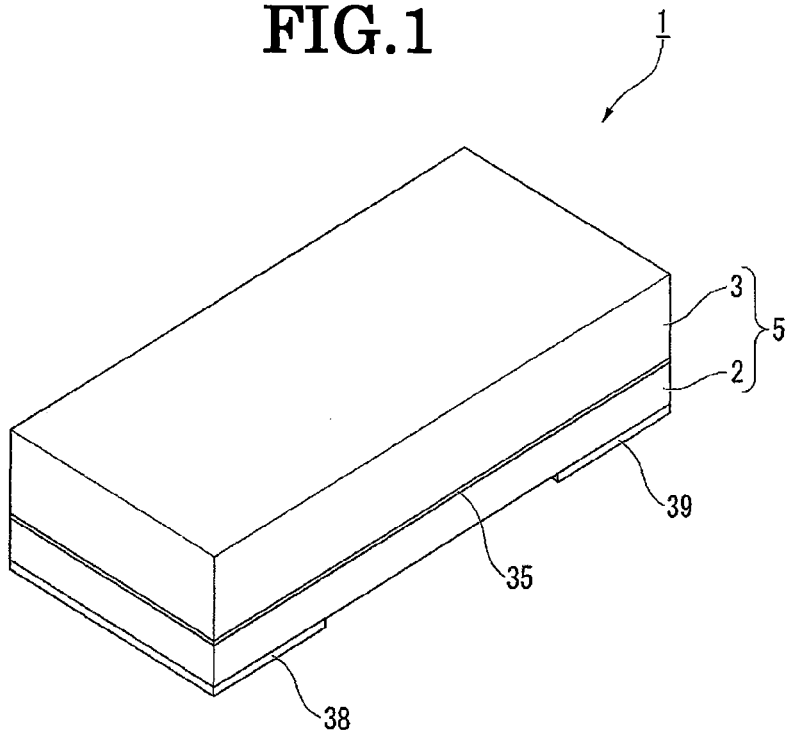
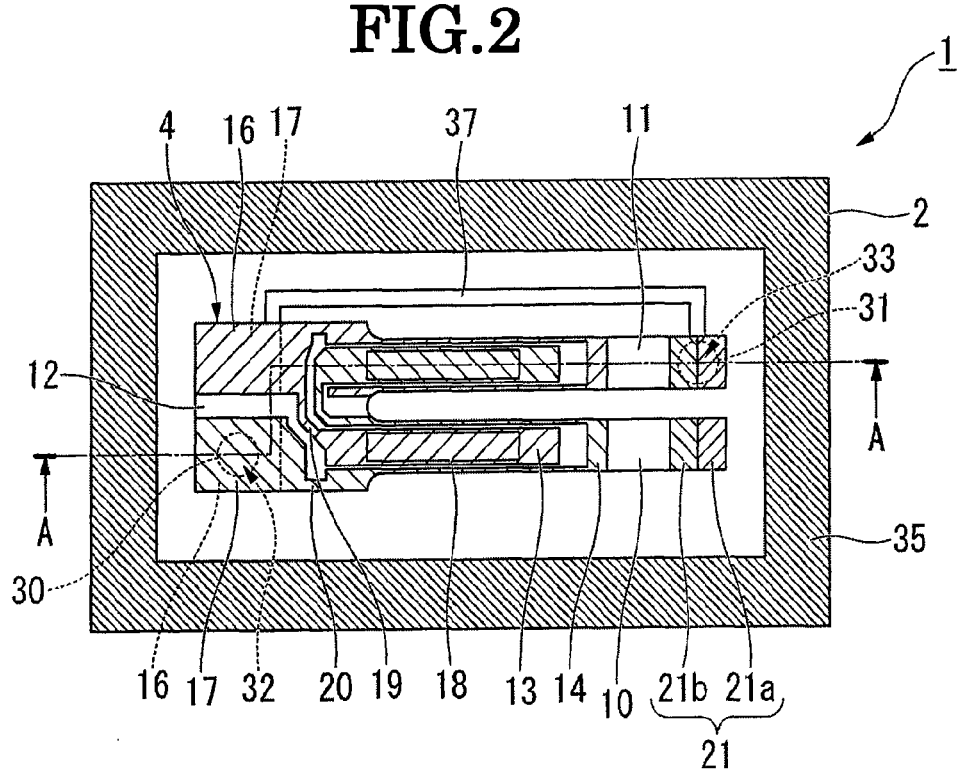

PIEZOELECTRIC VIBRATOR MANUFACTURING METHOD, PIEZOELECTRIC VIBRATOR, OSCILLATOR, ELECTRONIC DEVICE, AND RADIO-CONTROLLED TIMEPIECE

RELATED APPLICATIONS

This application is a continuation of PCT/JP2008/071645 filed on Nov. 28, 2008. The entire contents of this application is incorporated herein by reference.

BACKGROUND OF THE INVENTION

1. Field of the Invention

The invention relates to a method for forming a surface mounted device (SMD)-type piezoelectric vibrator in which a piezoelectric vibrating reed is sealed in a cavity formed between two bonded substrates, a piezoelectric vibrator manufactured by the manufacturing method, and an oscillator, an electronic device, and a radio-controlled timepiece each having the piezoelectric vibrator.

2. Description of the Related Art

Recently, a piezoelectric vibrator utilizing quartz or the like has been used in cellular phones and portable information terminals as the time source, the timing source of a control signal, a reference signal source, and the like. Although there are various piezoelectric vibrators of this type, a surface mounted device-type piezoelectric vibrator is known as one example thereof. As the main piezoelectric vibrator of this type, generally, a three-layered piezoelectric vibrator in which a piezoelectric substrate having a piezoelectric vibrating reed formed thereon is interposed between the base substrate and a lid substrate from above or below is known. In this case, the piezoelectric vibrating reed is accommodated in a cavity (sealed space) that is formed between the base substrate and the lid substrate.

Moreover, in recent years, instead of the three-layered piezoelectric vibrator, a two-layered piezoelectric vibrator has also been developed. The piezoelectric vibrator of this type has a two-layered structure in which a base substrate and a lid substrate are directly bonded, and a piezoelectric vibrating reed is accommodated in a cavity formed between the two substrates. The two-layered piezoelectric vibrator is ideally used, as it is superior for achieving a thin profile compared with the three-layered structure.

As a piezoelectric vibrator of this type, as disclosed in Patent Document 1 as below, a configuration is known in which penetration holes are provided in a substrate (base substrate) formed of glass or ceramics, a wiring metal is formed on the inner surfaces of the penetration holes and the upper and lower surfaces around the penetration holes or either of the surfaces, alloys are welded to the penetration holes to form airtight terminals, and a crystal reed (piezoelectric vibrating reed) provided on the substrate surface is electrically connected directly to the alloys of the airtight terminals or through the wiring metal on the substrate surface. According to this configuration, a predetermined driving voltage can be applied to the piezoelectric vibrating reed from the outside of the piezoelectric vibrator through the airtight terminals, namely penetration electrodes which are electrodes formed so as to penetrate through the substrate.

Moreover, in the piezoelectric vibrator, the substrate and a cover (lid substrate) provided to the substrate are anodically bonded together by an anodic bonding metal film formed on the cover. As an example of an embodiment in which the substrate and the cover are anodically bonded together in such a way, a method is known in which a substrate and a cover superimposed onto each other with a metal film disposed therebetween are set on an electrode substrate of an anodic bonding machine, and a predetermined bonding voltage is applied between the metal film and the electrode substrate. According to this method, it is possible to cause an electrochemical reaction to occur at the interface between the metal film and the substrate. As a result, the metal film and the substrate are closely adhered tightly, whereby the substrate and the cover are anodically bonded together.

Meanwhile, in piezoelectric vibrators, it is generally preferable to suppress an equivalent resistance value (effective resistance value Re) to a low value. Since a piezoelectric vibrator having a low equivalent resistance value is capable of vibrating a piezoelectric vibrating reed with a low power, a high-quality piezoelectric vibrator having high energy efficiency can be achieved. Moreover, as the inside the cavity in which the piezoelectric reed is sealed approaches/is close to a vacuum, that is, as the degree of vacuum in the cavity increases, the equivalent resistance value can be suppressed to be lower is generally known.

Patent Document 1: JP-A-6-283951

However, the piezoelectric vibrator of the related art and the manufacturing method thereof have the following problems.

First, although the bonding film used for anodic bonding is generally formed by photolithography, since the apparatus needed for the photolithography is expensive, there is a problem in that bonding the base substrate and the lid substrate by anodic bonding incurs large costs.

Another problem is that when the base substrate and the lid substrate are bonded by anodic bonding, since a reaction gas mainly composed of oxygen is generated when an electrochemical reaction occurs at the interface between the bonding film and the substrate during the anodic bonding. Therefore, the reaction gas is sealed in the cavity by the bonding, and the degree of vacuum of the cavity decreases, which influences the quality of the piezoelectric vibrator.

The invention has been made in view of the above problems, and an object of the invention is to provide a high-quality, two-layered surface mounted device-type piezoelectric vibrator which can be manufactured at a low cost and in which a decrease in the degree of vacuum in the cavity is suppressed and a method for manufacturing the piezoelectric vibrator. Moreover, another object of the invention is to provide an oscillator, an electronic device, and a radio-controlled timepiece each having the piezoelectric vibrator.

SUMMARY OF THE INVENTION

The invention provides the following means in order to solve the problems to attain the objects.

(1) The invention provides a method for manufacturing a piezoelectric vibrator including: a package in which a first substrate and a second substrate are superimposed so as to form a cavity therebetween; outer electrodes which are superimposed so as to form a cavity therebetween; outer electrodes which are formed on an outer surface of the first substrate; inner electrodes which are formed on the first substrate so as to be accommodated in the cavity; penetration electrodes which are formed so as to penetrate through the first substrate so that the outer electrodes and the inner electrodes are electrically connected; and a piezoelectric vibrating reed which is sealed in the cavity and electrically connected to the inner electrodes at the inner side of the cavity, the method including: a bonding film forming step of forming a bonding film on at least one of the first substrate and the second substrate using a low-melting-point glass so as to bond the two substrates; a mounting step of electrically connecting the piezoelectric vibrating reed to the inner electrodes formed on the first substrate; a loading step of loading the first substrate and the second substrate in a vacuum chamber of which the inner pressure can be controlled after the bonding film forming step and the mounting step are performed; a heating step of heating the bonding film after the bonding film forming step and the mounting step are performed; a depressurization step of depressurizing the inside of the vacuum chamber after the loading step is performed; and a bonding step of superimposing the first substrate and the second substrate onto each other at the inner side of the vacuum chamber with the bonding film disposed therebetween while heating the bonding film to a predetermined bonding temperature to thereby bond the two substrates by the bonding film after the heating step and the depressurization step are performed, wherein in the heating step, the bonding film is heated to a temperature higher than the bonding temperature.

According to the manufacturing method, the bonding film is formed of a low-melting-point glass in the bonding film forming step. Therefore, the bonding film can be formed, for example, by screen printing and the like as described above, and an expensive apparatus which is needed in photolithography used in the related art in the process of forming the bonding film is not required. Thus, the piezoelectric vibrator can be manufactured at a low cost.

Since organic materials, moisture, and the like are generally contained in the low-melting-point glass, when the bonding film is heated, the organic material, moisture, and the like in the bonding film are discharged to the outside as outgas.

Here, in the heating step, since the bonding film is heated to a temperature higher than the bonding temperature, outgas which will be discharged from the bonding film when the bonding film is heated to the bonding temperature can be discharged in advance. Therefore, the outgas discharged from the bonding film when the bonding film is heated to the bonding temperature in the bonding step which is performed later than the heating step can be suppressed to a very small amount.

Given the above, it is possible to suppress a decrease in the degree of vacuum in the cavity by the outgas discharged from the bonding film. Thus, it is possible to manufacture the piezoelectric vibrator having a further higher quality.

Moreover, when the depressurization step is performed later than the heating step, even if the outgas in the vacuum chamber is discharged in the heating step performed later than the loading step, it is possible to remove the outgas from the inside of the vacuum chamber. Thus, it is possible to obtain the above-described operational effects more reliably.

(2) In the mounting step, the piezoelectric vibrating reed may be bump-bonded to the inner electrodes through gold bumps.

In this case, since the piezoelectric vibrating reed and the inner electrodes are bump-bonded by the gold bumps, it is possible to secure reliable conduction between the piezoelectric vibrating reed and the extraction electrodes and to manufacture the piezoelectric vibrator having high quality. In addition, since gold has a higher melting point as compared to a conductive adhesive or the like which has been used for mounting the piezoelectric vibrating reed, the gold bumps can reliably support the piezoelectric vibrating reed without being affected by heating even when the bonding film is heated to the bonding temperature in the bonding step and when the bonding film is heated to a temperature higher than the bonding temperature in the heating step. Thus, it is possible to manufacture the piezoelectric vibrator having a further higher quality.

(3) The bonding temperature may be equal to or higher than 300° C.

In this case, since the bonding temperature is equal to or higher than 300° C., even when the piezoelectric vibrator manufactured by the manufacturing method is mounted on other products as one component using, for example, a reflow method or the like which involves heating, it is possible to suppress generation of outgas. In this way, it is possible to reliably suppress a decrease in the quality of the piezoelectric vibrator when mounting the piezoelectric vibrator.

(4) The invention also provides a piezoelectric vibrator including: a package in which a first substrate and a second substrate are superimposed so as to form a cavity therebetween; outer electrodes which are formed on an outer surface of the first substrate; inner electrodes which are formed on the first substrate so as to be accommodated in the cavity; penetration electrodes which are formed so as to penetrate through the first substrate so that the outer electrodes and the inner electrodes are electrically connected; and a piezoelectric vibrating reed which is sealed in the cavity and electrically connected to the inner electrodes at the inner side of the cavity, wherein the first substrate and the second substrate are bonded by a bonding film that is formed of a low-melting-point glass, and wherein the bonding film is heated to a predetermined bonding temperature when the first substrate and the second substrate are bonded together, and is formed by being heated to a temperature higher than the bonding temperature before the bonding is performed.

According to the piezoelectric vibrator, since the bonding film is formed of a low-melting-point glass, it is possible to form the bonding film without using an expensive apparatus which is needed in photolithography in the step of forming the bonding film and to form the piezoelectric vibrator at a low cost. Moreover, since the bonding film is heated to a temperature higher than the bonding temperature before the first substrate and the second substrate are bonded together, the outgas which will be discharged from the bonding film when the bonding film is heated to the bonding temperature can be discharged in advance. Therefore, it is possible to suppress the outgas from being discharged from the bonding film when the two substrates are bonded together to thereby suppress a decrease in the degree of vacuum of the cavity. Thus, it is possible to improve the quality of the piezoelectric vibrator.

(5) The piezoelectric vibrating reed may be bump-bonded to the inner electrodes through gold bumps.

In this case, since the piezoelectric vibrating reed and the inner electrodes are bump-bonded by the gold bumps, it is possible to secure reliable conduction between the piezoelectric vibrating reed and the inner electrodes and to manufacture the piezoelectric vibrator having high quality. In addition, since gold has a higher melting point as compared to a conductive adhesive or the like which has been used for mounting the piezoelectric vibrating reed, the gold bumps can reliably support the piezoelectric vibrating reed without being affected by heating even when the bonding film is heated. Thus, it is possible to further improve the quality of the piezoelectric vibrator.

(6) The invention also provides an oscillator in which the piezoelectric vibrator according to (4) or (5) is electrically connected to an integrated circuit as an oscillating piece.

(7) The invention also provides an electronic device in which the piezoelectric vibrator according to (4) or (5) is electrically connected to a clock section.

(8) The invention also provides a radio-controlled timepiece in which the piezoelectric vibrator according to (4) or (5) is electrically connected to a filter section.

According to the oscillator, the radio-controlled timepiece, and the electronic device, since they have the piezoelectric vibrator which can be manufactured at a low cost and has a high quality, it is possible to achieve high quality and cost reductions.

According to the piezoelectric vibrator manufacturing method of the invention, it is possible to manufacture a high-quality piezoelectric vibrator in which a decrease in the degree of vacuum in the cavity is suppressed and which can be manufactured at a low cost.

Moreover, according to the piezoelectric vibrator of the invention, it is possible to achieve high quality and cost reductions.

Furthermore, according to the oscillator, the electronic device, and the radio-controlled timepiece having the piezoelectric vibrator, it is possible to achieve high quality and cost reductions.

BRIEF DESCRIPTION OF THE DRAWINGS

FIG. 1 is a perspective view showing an external appearance of an example of a piezoelectric vibrator according to an embodiment of the invention.

FIG. 2 is a top view showing an inner structure of the piezoelectric vibrator shown in FIG. 1 when a piezoelectric vibrating reed is viewed from above with lid substrate removed.

DETAILED DESCRIPTION OF THE PREFERRED EMBODIMENTS (Piezoelectric Vibrator)

Hereinafter, an embodiment of a piezoelectric vibrator according to the invention will be described with reference to the drawings.

In a piezoelectric vibrator 1 of the present embodiment, as shown in FIGS. 1 to 4, a base substrate (first substrate) 2 and a lid substrate (second substrate) 3 are laminated in two layers to form a box-like package 5. Moreover, the piezoelectric vibrator 1 is a surface mounted device-type piezoelectric vibrator in which a piezoelectric vibrating reed 4 is accommodated in a cavity C at the inner side of the package 5.

Figure 4:
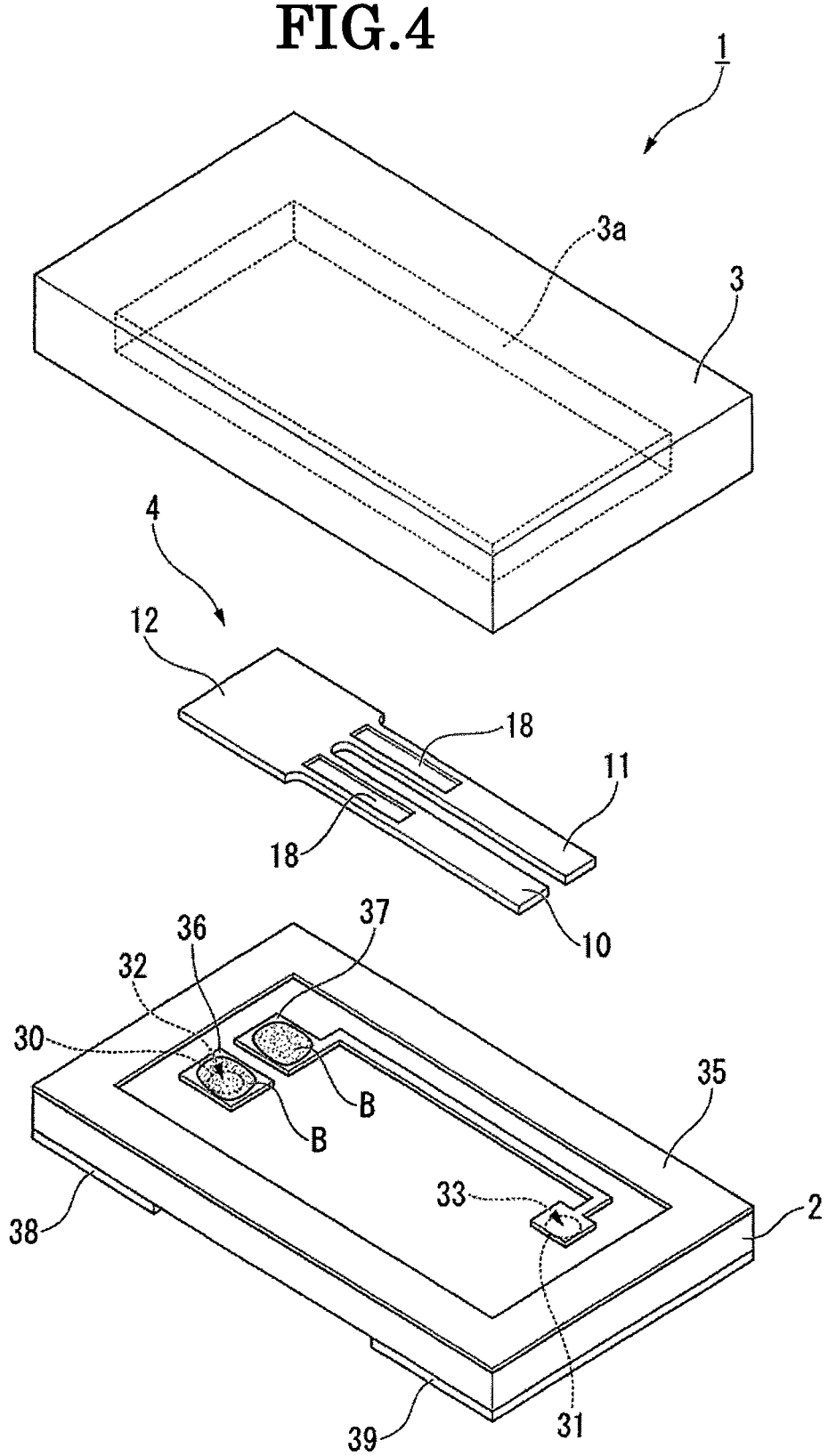
FIG. 4 is an exploded perspective view of the piezoelectric vibrator shown in FIG. 1.

In FIG. 4, for better understanding of the drawings, illustrations of the excitation electrode 15, extraction electrodes 19 and 20, mount electrodes 16 and 17, and weight metal film 21 described later are omitted.

Figure 5:
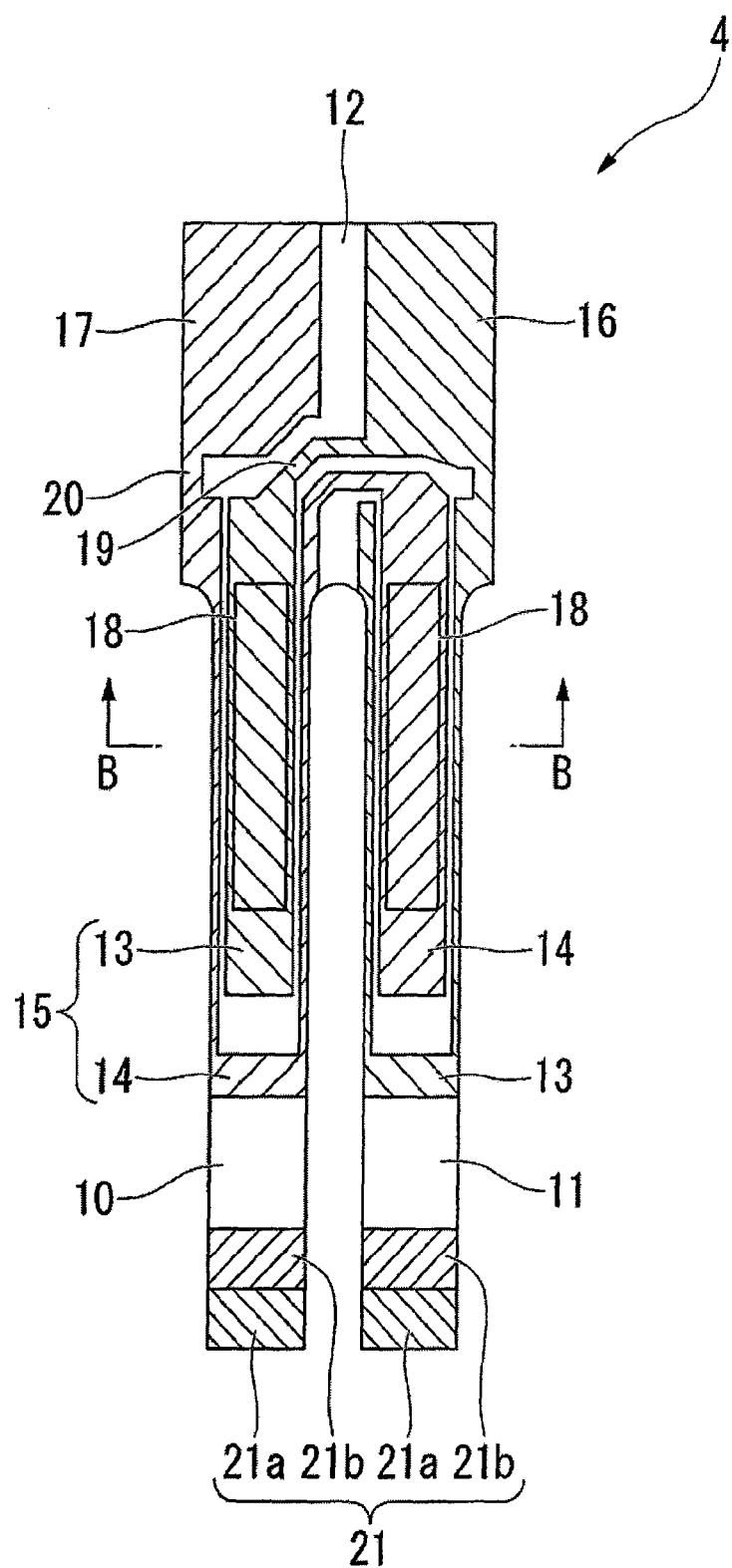
FIG. 5 is a top view of the piezoelectric vibrating reed that constitutes the piezoelectric vibrator shown in FIG. 1.
Figure 6:
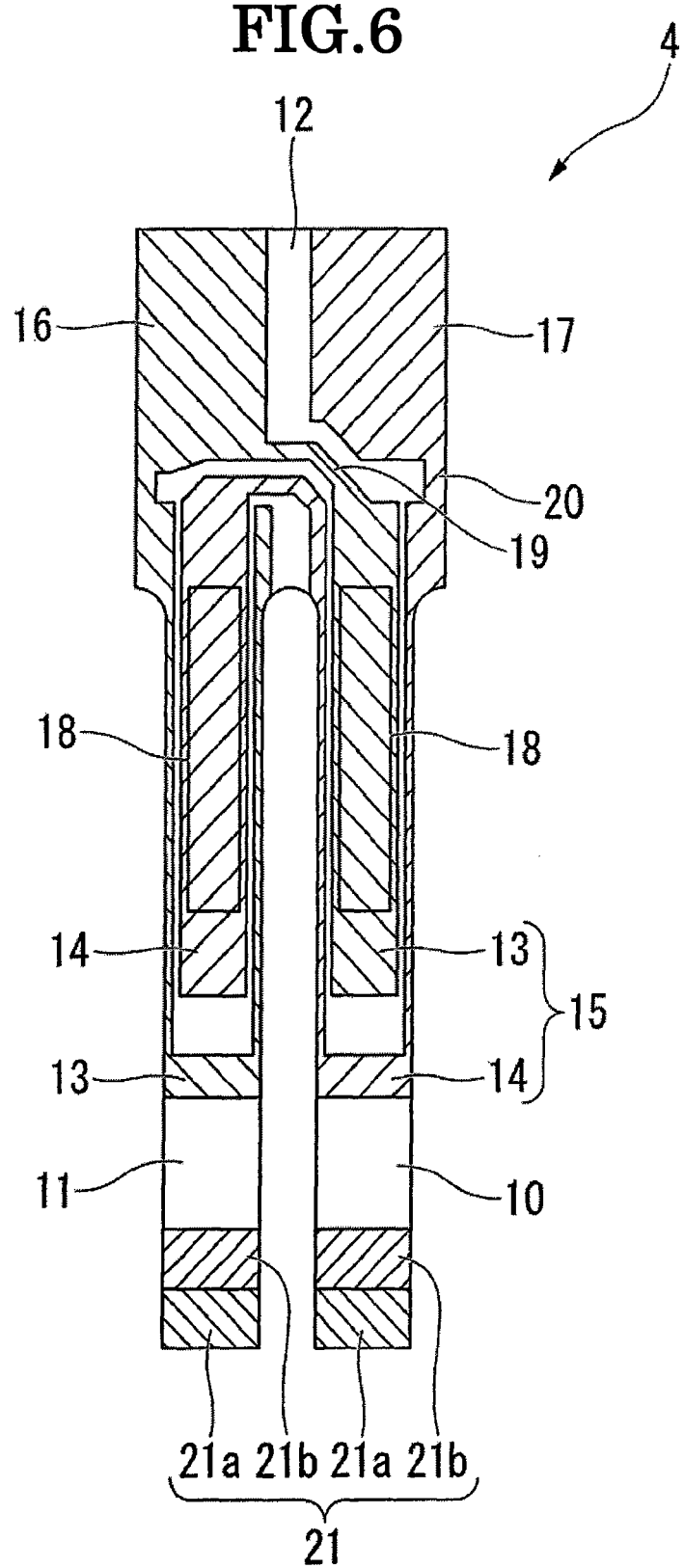
FIG. 6 is a bottom view of the piezoelectric vibrating reed shown in FIG. 5.
Figure 7:
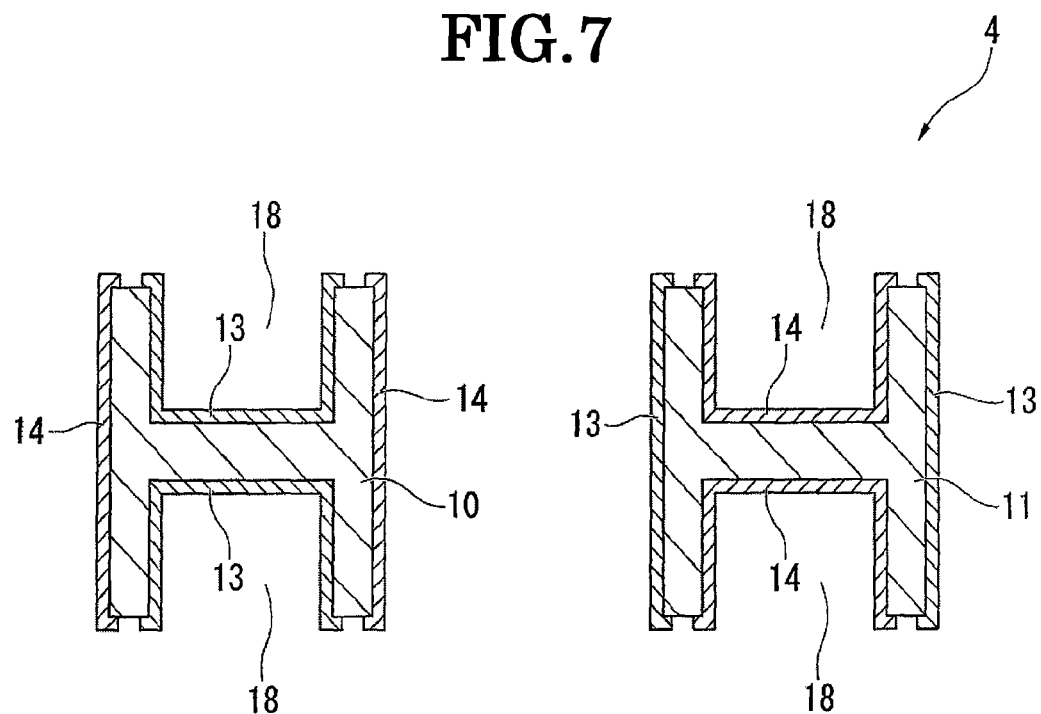
FIG. 7 is a cross-sectional view taken along the line B-B in FIG. 5.

As shown in FIGS. 5 to 7, the piezoelectric vibrating reed 4 is a tuning-fork type vibrating reed which is formed of a piezoelectric material such as crystal, lithium tantalate, or lithium niobate and is configured to vibrate when a predetermined voltage is applied thereto.

The piezoelectric vibrating reed 4 includes: a pair of vibrating arms 10 and 11 disposed in parallel to each other; a base portion 12 to which the base end sides of the pair of vibrating arms 10 and 11 are integrally fixed; an excitation electrode 15 which is formed on the outer surfaces of the pair of vibrating arms 10 and 11 so as to allow the pair of vibrating arms 10 and 11 to vibrate and includes a first excitation electrode 13 and a second excitation electrode 14; and mount electrodes 16 and 17 which are electrically connected to the first excitation electrode 13 and the second excitation electrode 14, respectively.

In addition, the piezoelectric vibrating reed 4 according to the present embodiment is provided with groove portions 18 which are formed on both principal surfaces of the pair of vibrating arms 10 and 11 along the longitudinal direction of the vibrating arms 10 and 11. The groove portions 18 are formed so as to extend from the base end sides of the vibrating arms 10 and 11 up to approximately the middle portions thereof.

The excitation electrode 15 including the first excitation electrode 13 and the second excitation electrode 14 is an electrode that allows the pair of vibrating arms 10 and 11 to vibrate at a predetermined resonance frequency in a direction moving closer to or away from each other and is patterned on the outer surfaces of the pair of vibrating arms 10 and 11 in an electrically isolated state. Specifically, as shown in FIG. 7, the first excitation electrode 13 is mainly formed on the groove portion 18 of one vibrating arm 10 and both side surfaces of the other vibrating arm 11. On the other hand, the second excitation electrode 14 is mainly formed on both side surfaces of one vibrating arm 10 and the groove portion 18 of the other vibrating arm 11.

Moreover, the first excitation electrode 13 and the second excitation electrode 14 are electrically connected to the mount electrodes 16 and 17 via the extraction electrodes 19 and 20, respectively, on both principal surfaces of the base portion 12. A voltage is applied to the piezoelectric vibrating reed 4 via the mount electrodes 16 and 17.

The above-mentioned excitation electrode 15, mount electrodes 16 and 17, and extraction electrodes 19 and 20 are formed by a coating of a conductive film of chromium (Cr), nickel (Ni), aluminum (Al), and titanium (Ti), for example.

The tip ends of the pair of the vibrating arms 10 and 11 are coated with a weight metal film 21 for adjustment (frequency adjustment) of their own vibration states in a manner such as to vibrate within a predetermined frequency range. The weight metal film 21 is divided into a rough tuning film 21a used for tuning the frequency roughly and a fine tuning film 21b used for tuning the frequency finely. By tuning the frequency with the use of the rough tuning film 21a and the fine tuning film 21b, the frequency of the pair of the vibrating arms 10 and 11 can be set to fall within the range of the nominal frequency of the device.

Figure 3:
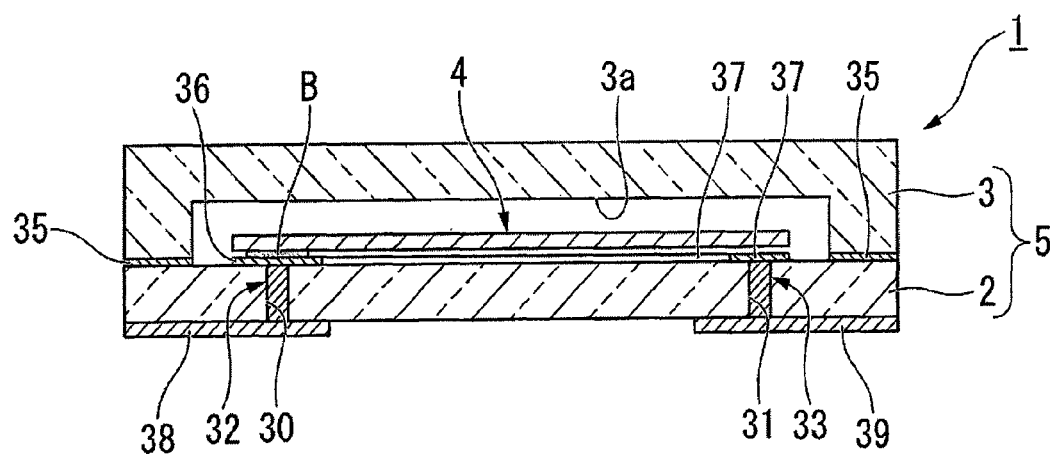
FIG. 3 is a cross-sectional view of the piezoelectric vibrator taken along the line A-A in FIG. 2.

The piezoelectric vibrating reed 4 configured in this way is bump-bonded to the upper surface of the base substrate 2 through gold bumps B as shown in FIGS. 3 and 4. More specifically, bump bonding is achieved in a state where the pair of mount electrodes 16 and 17 come into contact with two gold bumps B formed on the lead-out electrodes 36 and 37, respectively, which are patterned on the upper surface of the base substrate 2. In this way, the piezoelectric vibrating reed 4 is supported in a state of being floated from the upper surface of the base substrate 2, and the mount electrodes 16 and 17 and the lead-out electrodes 36 and 37 are electrically connected to each other.

The lid substrate 3 is a transparent insulating substrate formed of a glass material, for example, soda-lime glass, and is formed in a plate-like shape as shown in FIGS. 1, 3, and 4. A bonding surface side thereof to be bonded to the base substrate 2 is formed with a rectangular recess portion 3a in which the piezoelectric vibrating reed 4 is accommodated. The recess portion 3a is a recess portion for a cavity serving as the cavity C that accommodates the piezoelectric vibrating reed 4 when the two substrates 2 and 3 are superimposed on each other. The lid substrate 3 is anodically bonded to the base substrate 2 in a state where the recess portion 3a faces the base substrate 2.

The base substrate 2 is a transparent insulating substrate formed of glass material, for example, soda-lime glass, similarly to the lid substrate 3, and is formed in a plate-like shape having a size capable of being superimposed on the lid substrate 3, as shown in FIGS. 1 to 4.

The base substrate 2 is formed with a pair of through-holes (penetration holes) 30 and 31 penetrating through the base substrate 2. At this time, the pair of through-holes 30 and 31 is formed so as to be received in the cavity C. More specifically, the through-holes 30 and 31 of the present embodiment are formed such that one through-hole 30 is positioned close to the base portion 12 of the mounted piezoelectric vibrating reed 4, and the other through-hole 31 is positioned close to the tip ends of the vibrating arms 10 and 11. In addition, although the present embodiment is described by way of an example of the through-holes which are configured to penetrate straight through the base substrate 2, the invention is not limited to this example, but for example, the through-holes may be formed in a tapered form whose diameter gradually decreases towards the lower surface of the base substrate 2. In any case, they only need to penetrate through the base substrate 2.

The pair of through-holes 30 and 31 is formed with a pair of penetration electrodes 32 and 33 which are formed so as to bury the through-holes 30 and 31. The penetration electrodes 32 and 33 are formed of a conductive material such as Ag paste.

As shown in FIGS. 1 to 4, on the upper surface side of the base substrate 2 (the bonding surface side to be bonded to the lid substrate 3), the pair of lead-out electrodes 36 and 37 is patterned by a conductive material (for example, aluminum) so as to be accommodated in the cavity C.

The pair of lead-out electrodes 36 and 37 is patterned so that one penetration electrode 32 of the pair of penetration electrodes 32 and 33 is electrically connected to one mount electrode 16 of the piezoelectric vibrating reed 4, and the other penetration electrode 33 is electrically connected to the other mount electrode 17 of the piezoelectric vibrating reed 4.

More specifically, one lead-out electrode 36 is formed right above the one penetration electrode 32 to be disposed right below the base portion 12 of the piezoelectric vibrating reed 4. Moreover, the other lead-out electrode 37 is formed to be disposed right above the other penetration electrode 33 after being led out from a position near the one lead-out electrode 36 towards the tip ends of the vibrating arms 10 and 11 along the vibrating arms 10 and 11.

Moreover, the gold bumps B are formed on the pair of lead-out electrodes 36 and 37, and the piezoelectric vibrating reed 4 is mounted using the gold bumps B. In this way, the one mount electrode 16 of the piezoelectric vibrating reed 4 is electrically connected to the one penetration electrode 32 through the one lead-out electrode 36, and the other mount electrode 17 is electrically connected to the other penetration electrode 33 through the other lead-out electrode 37.

Moreover, on the lower surface of the base substrate 2, the outer electrodes 38 and 39 are formed so as to be electrically connected to the pair of penetration electrodes 32 and 33, respectively, as shown in FIGS. 1, 3, and 4. That is, one outer electrode 38 is electrically connected to the first excitation electrode 13 of the piezoelectric vibrating reed 4 via the one penetration electrode 32 and the one lead-out electrode 36. In addition, the other outer electrode 39 is electrically connected to the second excitation electrode 14 of the piezoelectric vibrating reed 4 via the other penetration electrode 33 and the other lead-out electrode 37.

Moreover, in the present embodiment, as shown in FIGS. 1 to 4, the base substrate 2 and the lid substrate 3 are bonded by a bonding film 35 formed of a low-melting-point glass. In the example shown in the figures, the bonding film 35 is formed on the upper surface side of the base substrate 2, and is formed along the peripheral edge of the base substrate 2 so as to surround the periphery of the recess portion 3a formed on the lid substrate 3.

Moreover, in the present embodiment, the bonding film 35 is heated to a predetermined bonding temperature T when bonding the base substrate 2 and the lid substrate 3 and is formed by being heated to a temperature higher than the bonding temperature T before the bonding is performed. This will be described in detail when describing the manufacturing method.

When the piezoelectric vibrator 1 configured in this manner is operated, a predetermined driving voltage is applied between the pair of outer electrodes 38 and 39 formed on the base substrate 2. In this way, a current can be made to flow to the excitation electrode 15 including the first and second excitation electrodes 13 and 14, of the piezoelectric vibrating reed 4, and the pair of vibrating arms 10 and 11 are allowed to vibrate at a predetermined frequency in a direction moving closer to or away from each other. This vibration of the pair of vibrating arms 10 and 11 can be used as the time source, the timing source of a control signal, the reference signal source, and the like.

(Piezoelectric Vibrator Manufacturing Method)

Next, a method for manufacturing a plurality of the above-described piezoelectric vibrators 1 at a time using a base substrate wafer 40 and a lid substrate wafer 50 will be described with reference to the flowchart shown in FIG. 8. Moreover, the piezoelectric vibrator manufacturing method according to the invention is not limited to a method of using the lid substrate wafer 50 and the base substrate wafer 40 described below. For example, one piezoelectric vibrator may be manufactured at a time using a chip-shaped wafer of which the outer dimensions are made in advance to comply with the base substrate 2 and the lid substrate 3 of the piezoelectric vibrator 1.

First, a piezoelectric vibrating reed manufacturing step is performed to manufacture the piezoelectric vibrating reed 4 shown in FIGS. 5 to 7 (S10). Moreover, after the piezoelectric vibrating reed 4 is manufactured, rough tuning of a resonance frequency is performed. This rough tuning is achieved by irradiating the rough tuning film 21a of the weight metal film 21 with a laser beam to partially evaporate the rough tuning film 21a, thus changing the weight thereof. Fine tuning of adjusting the resonance frequency more accurately is performed after a mounting step is performed. This fine tuning will be described later.

Figure 9:
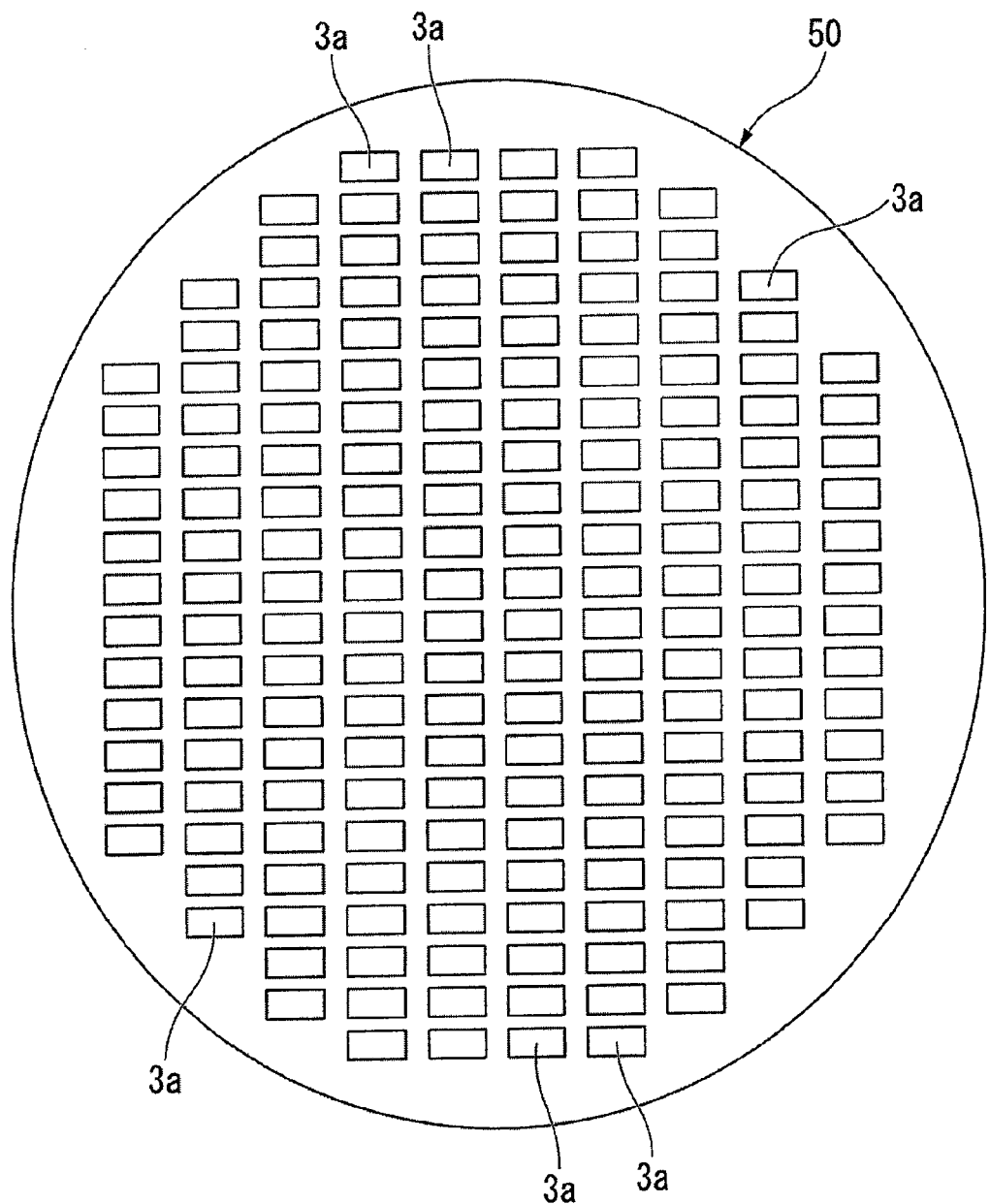
FIG. 9 is a view showing one step of the manufacturing process of the piezoelectric vibrator in accordance with the flowchart shown in FIG. 8, showing a state where a plurality of recess portions and a bonding film are formed on a lid substrate wafer serving as a base material of a lid substrate.

Subsequently, a first wafer manufacturing step is performed where a lid substrate wafer 50 later serving as the lid substrate 3 is manufactured up to the stage immediately before bonding is achieved (S20). First, a disk-shaped lid substrate wafer 50 is formed by polishing a soda-lime glass to a predetermined thickness, cleaning the polished glass, and removing the affected uppermost layer by etching or the like as shown in FIG. 9 (S21). After that, a recess forming step is performed where a plurality of recess portions 3a to be used as a cavity is formed in a matrix form on the bonding surface of the lid substrate wafer 50 by etching or the like (S22). The first wafer manufacturing step ends at this point.

Subsequently, at the same or a different time as the above-mentioned step, a second wafer manufacturing step is performed where a base substrate wafer 40 later serving as the base substrate 2 is manufactured up to the stage immediately before bonding is achieved (S30). First, a disk-shaped base substrate wafer 40 is formed by polishing a soda-lime glass to a predetermined thickness, cleaning the polished glass, and removing the affected uppermost layer by etching or the like (S31). After that, a penetration electrode forming step is performed where a plurality of penetration electrodes 32 and 33 is formed on the base substrate wafer 40 (S32).

Figure 10:
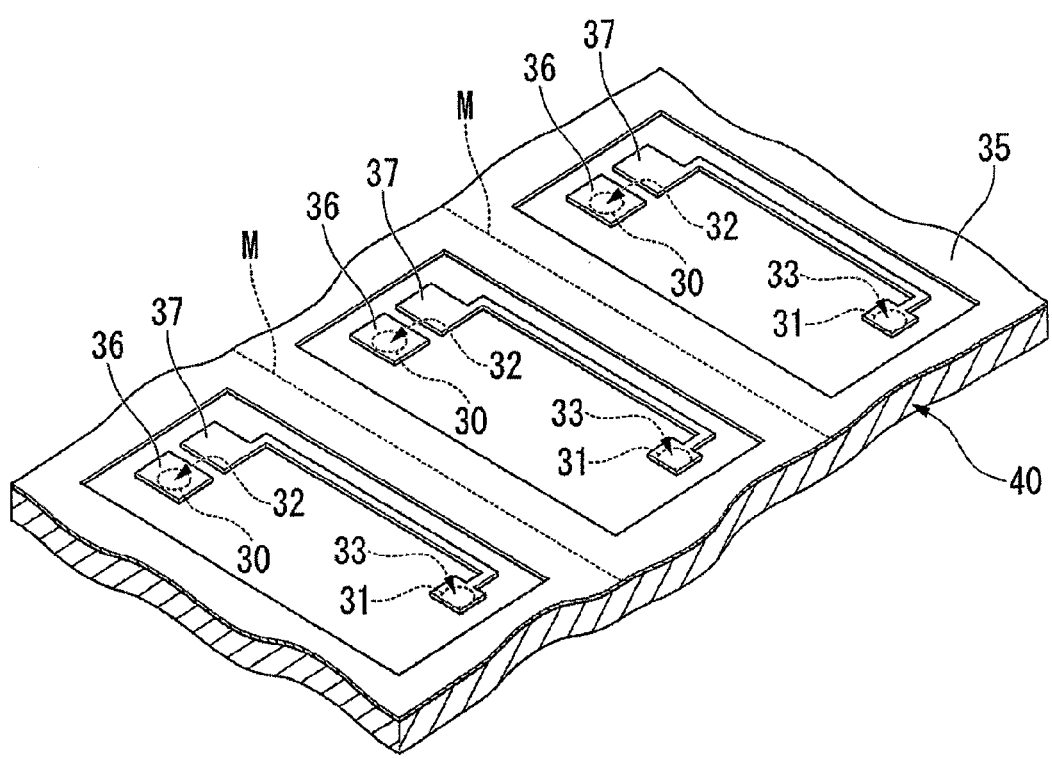
FIG. 10 is a view showing one step of the manufacturing process of the piezoelectric vibrator in accordance with the flowchart shown in FIG. 8, showing a state where a bonding film and lead-out electrodes are patterned on the upper surface of a base substrate wafer.

After that, as shown in FIG. 10, a bonding film forming step is performed where the bonding film 35 is formed on the upper surface of the base substrate wafer 40 using a low-melting-point glass (S33). At that time, after a gel-like low-melting-point glass is printed on the upper surface of the base substrate wafer 40 at room temperature by screen printing or the like, the glass is fused by baking and slowly cooled down to room temperature, whereby the bonding film 35 is formed.

Figure 11:
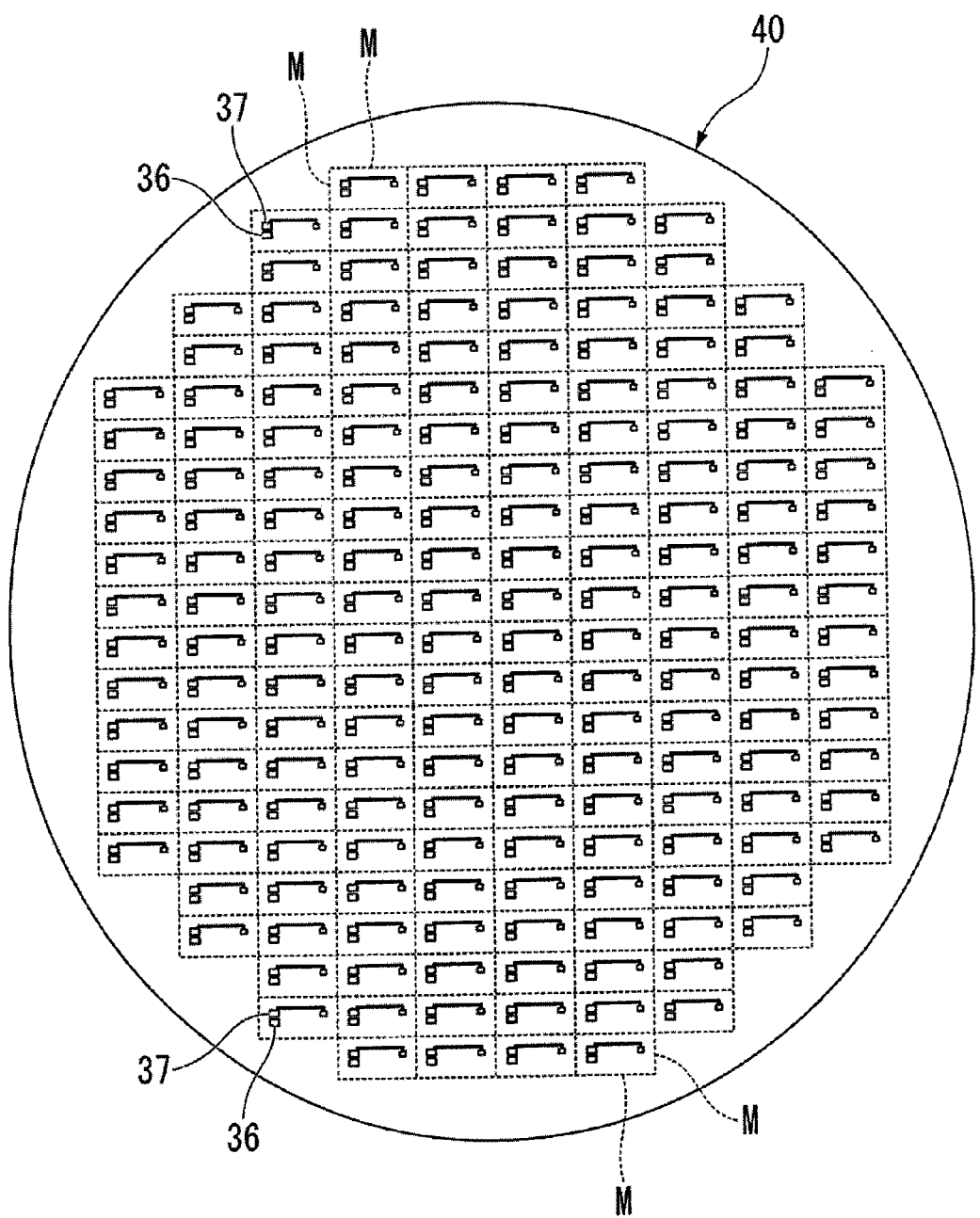
FIG. 11 is an overall view of the base substrate wafer in the state shown in FIG. 10.

Subsequently, as shown in FIGS. 10 and 11, a lead-out electrode forming step is performed where a conductive material is patterned on the upper surface of the base substrate wafer 40 so as to form a plurality of lead-out electrodes 36 and 37 which are electrically connected to each pair of the penetration electrodes 32 and 33 (S34). In FIG. 11, for better understanding of the drawing, the illustration of the bonding film 35 is omitted.

The second wafer manufacturing step ends at this point.

Figure 8:
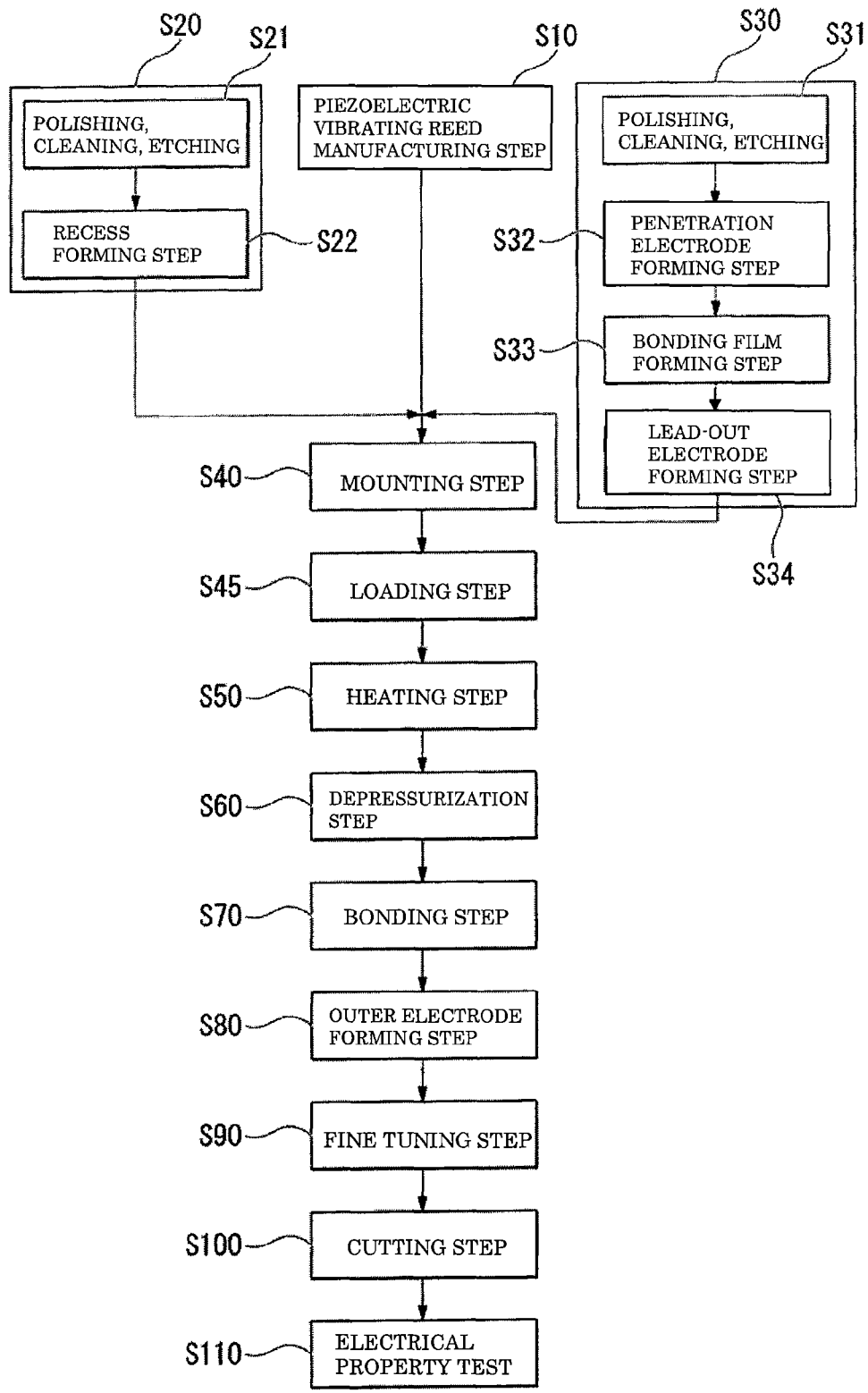
FIG. 8 is a flowchart showing the flow of the manufacturing process of the piezoelectric vibrator shown in FIG. 1.

In FIG. 8, although the lead-out electrode forming step (S34) is performed after the bonding film forming step (S33), conversely, the bonding film forming step (S33) may be performed after the lead-out electrode forming step (S34). The same operational effect can be obtained with any order of the steps. Therefore, the order of the steps may be appropriately changed according to need.

Subsequently, a mounting step is performed where a plurality of manufactured piezoelectric vibrating reeds 4 is bonded to the upper surface of the base substrate wafer 40 with the lead-out electrodes 36 and 37 disposed therebetween (S40). At that time, first, gold bumps B are formed on the pair of lead-out electrodes 36 and 37. Moreover, the base portion 12 of the piezoelectric vibrating reed 4 is placed on the gold bumps B, and thereafter, the piezoelectric vibrating reed 4 is pressed against the gold bumps B while heating the gold bumps B to a predetermined temperature. In this way, the piezoelectric vibrating reed 4 is mechanically supported by the gold bumps B, and the mount electrodes 16 and 17 are electrically connected to the lead-out electrodes 36 and 37. Therefore, at this point, the pair of excitation electrodes 15 of the piezoelectric vibrating reed 4 are electrically connected to the pair of penetration electrodes 32 and 33, respectively.

Particularly, since the piezoelectric vibrating reed 4 is bump-bonded, the piezoelectric vibrating reed 4 is supported in a state of being floated from the upper surface of the base substrate wafer 40.

Figure 12:
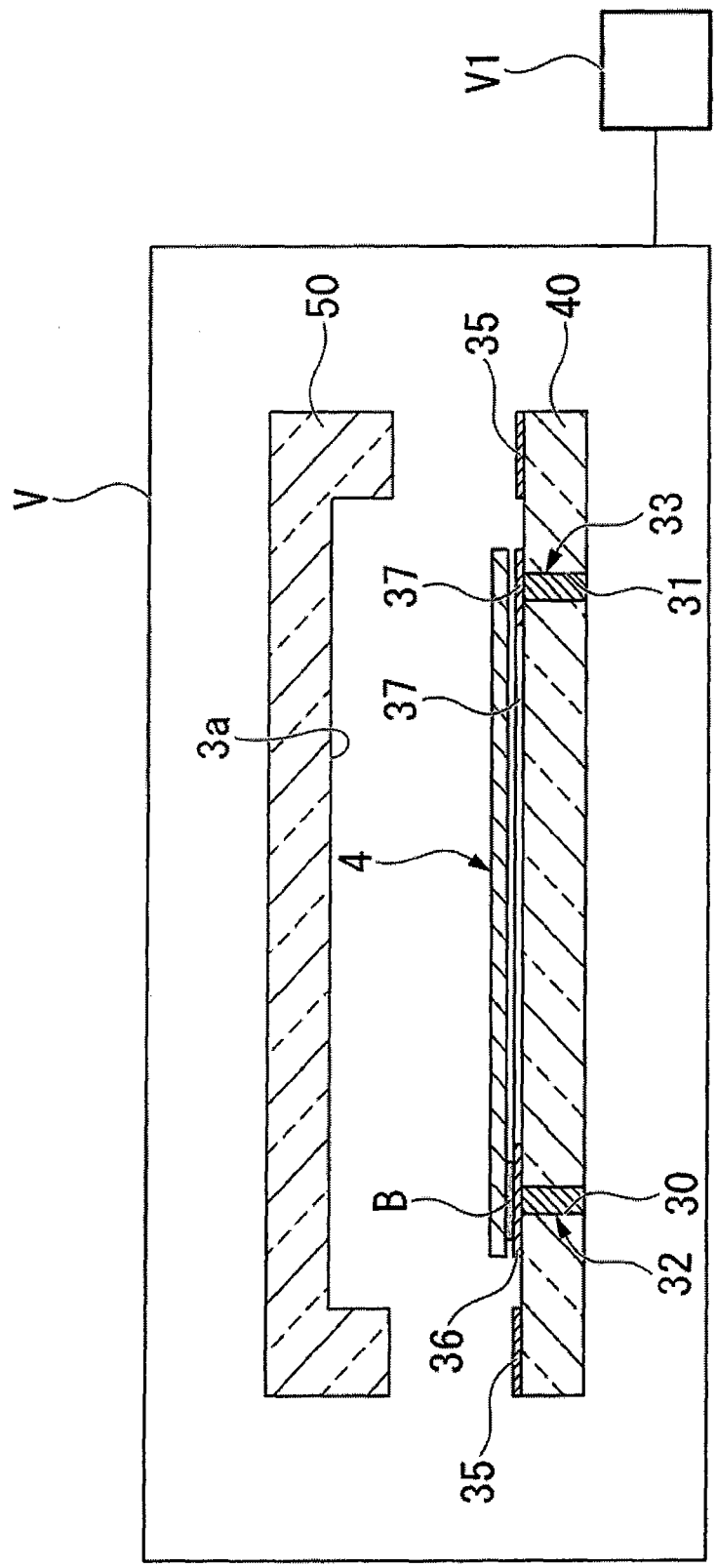
FIG. 12 is a view showing one step of the process of manufacturing the piezoelectric vibrator in accordance with the flowchart shown in FIG. 8, and is a view showing a state where the base substrate wafer and the lid substrate wafer are loaded into a vacuum chamber.

Subsequently, as shown in FIG. 12, a loading step is performed where the lid substrate wafer 50 and the base substrate wafer 40 are loaded into a vacuum chamber V of which the inner pressure can be controlled (S45).

Subsequently, a heating step is performed where the bonding film 35 is heated to a temperature higher than a bonding temperature T (S50). Here, the bonding temperature T is a temperature at which the bonding film 35 is heated in a bonding step (S70) described later, and in the present embodiment, the bonding temperature T is 300° C. That is, in the heating step, the bonding film 35 is heated for a predetermined period at a temperature higher than 300° C. Heating the bonding film 35 is not limited to a case of heating only the bonding film 35 but also includes a case where the bonding film 35 is heated together with the base substrate wafer 40 on which the bonding film 35 is formed, etc.

Moreover, in the present embodiment, a pair of wafer clamping means (not shown) which is provided so as to face each other and be movable in a direction closer to or away from each other is provided in the vacuum chamber V. When the lid substrate wafer 50 and the base substrate wafer 40 are loaded into the vacuum chamber V, as shown in FIG. 12, the respective wafers 40 and 50 are set on the respective wafer clamping means in a state where the upper surfaces of the respective wafers 40 and 50 face each other and the two wafers 40 and 50 are separated from each other. Moreover, at that time, the respective wafers 40 and 50 may be set on the wafer clamping means in a state where they are aligned using reference marks or the like not shown as indices, for example.

Here, since organic materials, moisture, and the like are generally contained in the low-melting-point glass, when the bonding film 35 is heated, the organic material, moisture, and the like in the bonding film 35 are discharged to the outside as outgas. In this heating step, since the bonding film 35 is heated to a temperature higher than the bonding temperature T, outgas which will be discharged from the bonding film 35 when the bonding film 35 is heated to the bonding temperature T can be discharged in advance.

Subsequently, a depressurization step is performed where the inside of the vacuum chamber V is depressurized (S60). In the present embodiment, a vacuum pump V1 which can control the inner pressure of the vacuum chamber V is provided in the vacuum chamber V, and the inside of the vacuum chamber V is depressurized by the vacuum pump V1. In this way, the outgas discharged in the heating step is removed from the inside of the vacuum chamber V.

Figure 13:
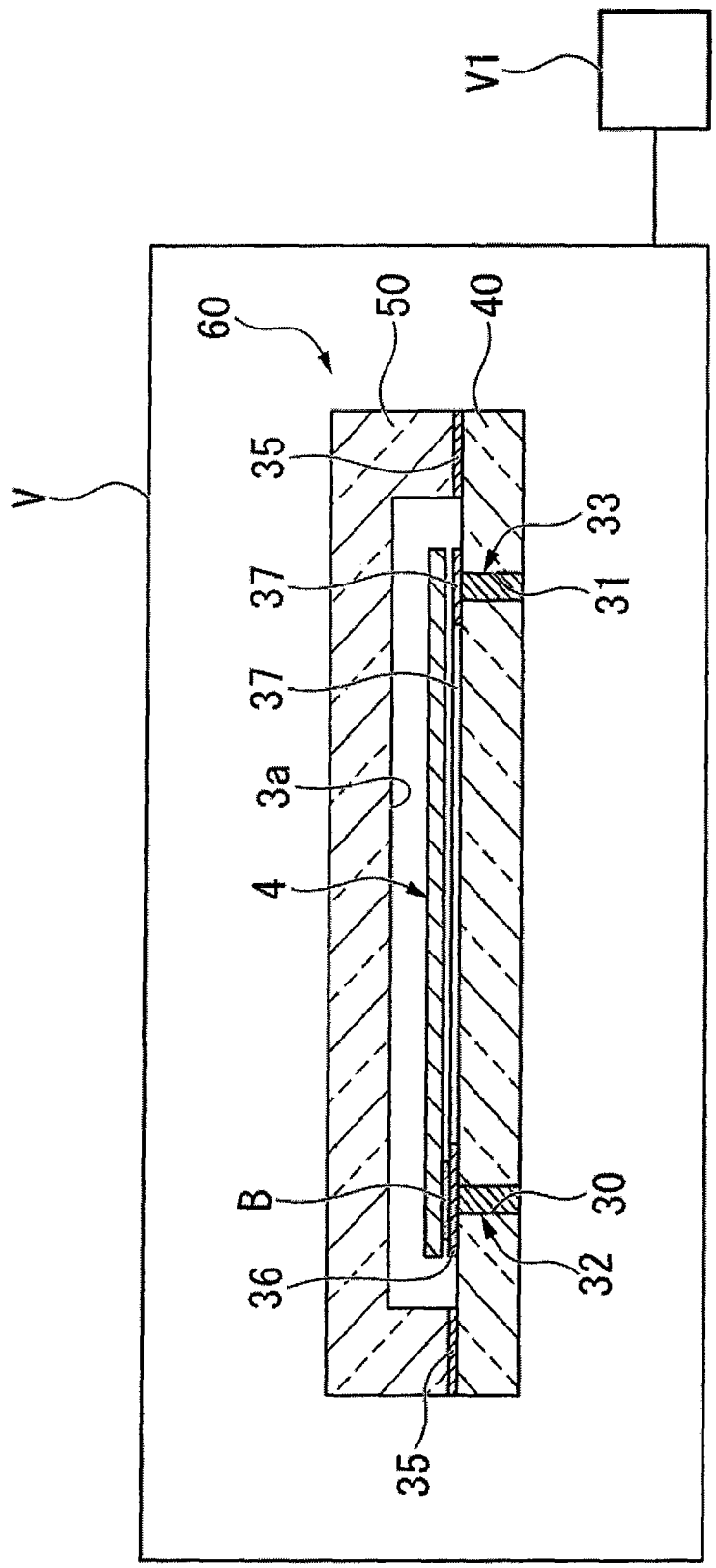
FIG. 13 is a view showing one step of the process of manufacturing the piezoelectric vibrator in accordance with the flowchart shown in FIG. 8, and is a view showing a state where the base substrate wafer and the lid substrate wafer are bonded together in the vacuum chamber.

Subsequently, as shown in FIG. 13, after the depressurization step, a bonding step is performed where the lid substrate wafer 50 and the base substrate wafer 40 are bonded inside the vacuum chamber V by the bonding film 35 (S70). At that time, in the present embodiment, the bonding is achieved by superimposing the lid substrate wafer 50 and the base substrate wafer 40 onto each other with the bonding film 35 disposed therebetween by moving the wafer clamping means closer to each other while heating the bonding film 35 to 300° C. which is the bonding temperature T. In addition, the bonding is achieved by the wafer clamping means pressurizing the two wafers 40 and 50 so that the bonding film 35 is sandwiched between them. Moreover, in order to achieve reliable bonding of the two wafers 40 and 50, the heating of the bonding film 35 at the bonding temperature T and the pressurization of the two wafers 40 and 50 are maintained for a predetermined period.

In this way, the piezoelectric vibrating reed 4 in which the two wafers 40 and 50 are bonded and which is mounted on the base substrate wafer 40 can be sealed in the cavity C which is formed between the two wafers 40 and 50, and a wafer assembly 60 in which the base substrate wafer 40 and the lid substrate wafer 50 are bonded to each other can be obtained. The predetermined period can be appropriately changed in accordance with the bonding temperature T, the force that pressurizes the two wafers 40 and 50, the strain point of the low-melting-point glass used as the bonding film 35, and the like. Moreover, in FIG. 14, for better understanding of the drawing, the wafer assembly 60 is illustrated in an exploded state. Furthermore, the illustration of the bonding film 35 in the base substrate wafer 40 is omitted. The dotted line M shown in FIG. 14 is a cutting line along which a cutting step performed later occurs.

Subsequently, the wafer assembly 60 is taken out of the vacuum chamber V, and an outer electrode forming step is performed where a conductive material is patterned onto the lower surface of the base substrate wafer 40 so as to form a plurality of pairs of outer electrodes 38 and 39 which is electrically connected to the pair of penetration electrodes 32 and 33 (S80). Through this step, the piezoelectric vibrating reed 4 which is sealed in the cavity C can be operated using the outer electrodes 38 and 39.

Subsequently, a fine tuning step is performed on the wafer assembly 60 where the frequencies of the individual piezoelectric vibrators 1 sealed in the cavities C are tuned finely to fall within a predetermined range (S90). Specifically, a voltage is applied to the pair of outer electrodes 38 and 39 which are formed on the lower surface of the base substrate wafer 40, thus allowing the piezoelectric vibrating reeds 4 to vibrate. A laser beam is irradiated onto the lid substrate wafer 50 from the outer side while measuring the vibration frequencies to evaporate the fine tuning film 21b of the weight metal film 21. In this way, since the weight on the tip end sides of the pair of vibrating arms 10 and 11 is changed, the fine tuning can be performed in such a way that the frequency of the piezoelectric vibrating reed 4 falls within the predetermined range of the nominal frequency.

Figure 14:
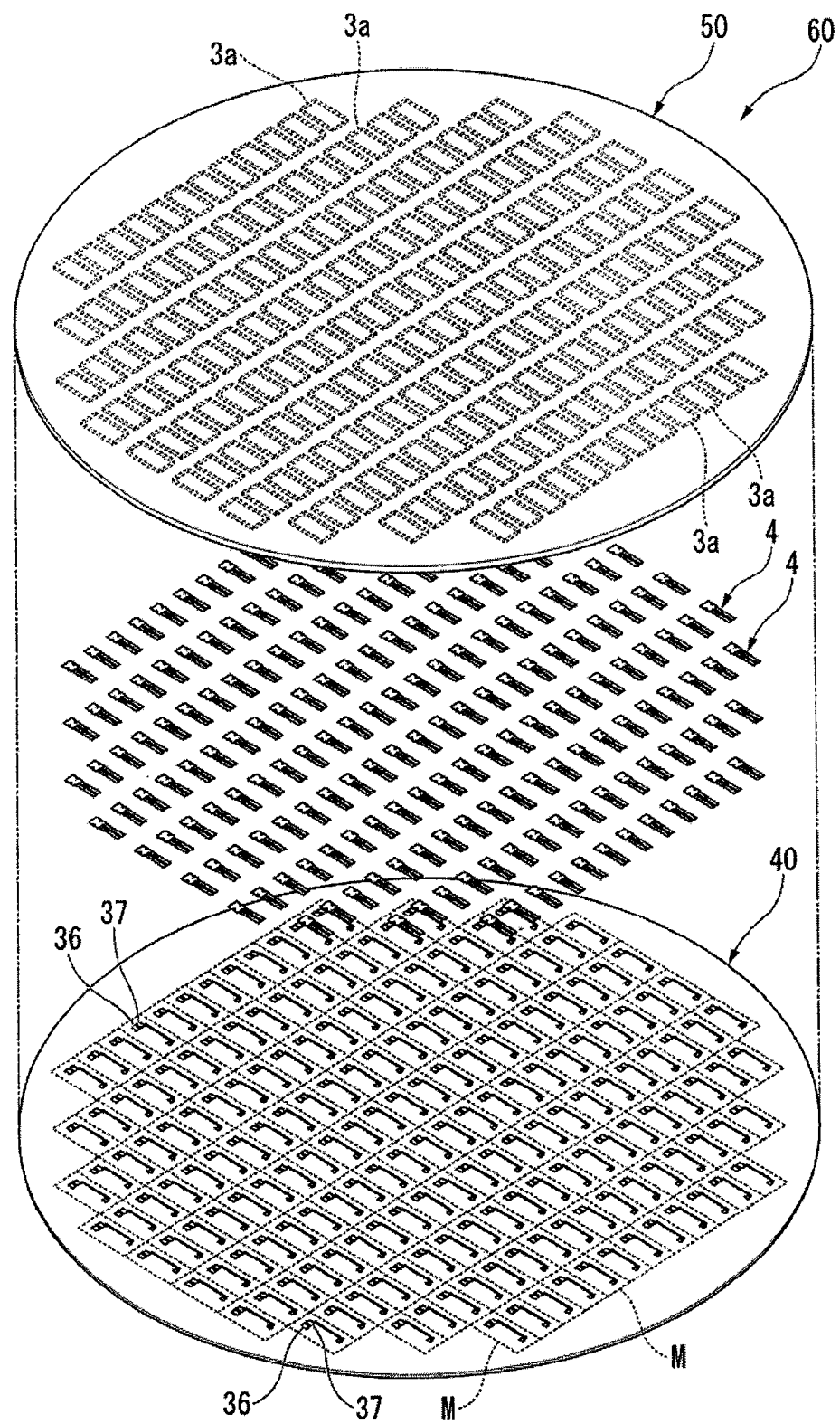
FIG. 14 is a view showing one step of the process of manufacturing the piezoelectric vibrator in accordance with the flowchart shown in FIG. 8, and is also an exploded perspective view of a wafer assembly in which the base substrate wafer and the lid substrate wafer are bonded with the piezoelectric vibrating reed accommodated in a cavity.

After the fine tuning of the frequency is completed, a cutting step is performed where the bonded wafer assembly 60 is cut along the cutting line M shown in FIG. 14 to obtain small fragments (S100). As a result, a plurality of two-layered surface mounted device-type piezoelectric vibrators 1 shown in FIG. 1, in which the piezoelectric vibrating reed 4 is sealed in the cavity C formed between the base substrate 2 and the lid substrate 3 being bonded together, can be manufactured at a time.

The fine tuning step (S90) may be performed after performing the cutting step (S100) to obtain the individual fragmented piezoelectric vibrators 1. However, as described above, by performing the fine tuning step (S90) earlier, since the fine tuning step can be performed on the wafer assembly 60, it is possible to perform the fine tuning on the plurality of piezoelectric vibrators 1 more efficiently. Therefore, it is desirable because throughput can be increased.

Subsequently, an inner electrical property test is conducted (S110). That is, the resonance frequency, resonance resistance value, drive level properties (the excitation power dependence of the resonance frequency and the resonance resistance value), and the like of the piezoelectric vibrating reed 4 are measured and checked. Moreover, the insulation resistance properties and the like are checked as well. Finally, an external appearance test of the piezoelectric vibrator 1 is conducted to check the dimensions, the quality, and the like. In this way, the manufacturing of the piezoelectric vibrator 1 ends.

As described above, in the piezoelectric vibrator manufacturing method according to the present embodiment, the bonding film 35 is formed of a low-melting-point glass in the bonding film forming step. Therefore, the bonding film 35 can be formed, for example, by screen printing and the like as described above, and an expensive apparatus which is needed in photolithography used in the related art in the process of forming the bonding film 35 is not required. Thus, the piezoelectric vibrator 1 can be manufactured at a low cost.

In addition, the bonding step is performed inside the vacuum chamber V after the depressurization step, that is, the bonding step is performed later than the heating step. Therefore, since the outgas discharged from the bonding film 35 when being heated to the bonding temperature in the bonding step can be suppressed to a very small amount, it is possible to suppress a decrease in the degree of vacuum in the cavity C by the outgas discharged from the bonding film 35. Thus, it is possible to manufacture the piezoelectric vibrator 1 having high quality.

Furthermore, since the piezoelectric vibrating reed 4 and the lead-out electrodes 36 and 37 are bump-bonded by the gold bumps B, it is possible to secure reliable conduction between the piezoelectric vibrating reed 4 and the lead-out electrodes 36 and 37 and to manufacture the piezoelectric vibrator 1 having high quality. In addition, since gold has a higher melting point as compared to a conductive adhesive or the like which has been used for mounting the piezoelectric vibrating reed 4, the gold bumps can reliably support the piezoelectric vibrating reed 4 without being affected by heating even when the bonding film 35 is heated to the bonding temperature T in the bonding step, and the bonding film 35 is heated to a temperature higher than the bonding temperature T in the heating step. Thus, it is possible to manufacture the piezoelectric vibrator 1 having a further higher quality.

In addition, since the bonding temperature T in the bonding step is equal to or higher than 300° C., even when the piezoelectric vibrator 1 manufactured by the manufacturing method is mounted on other products as one component using, for example, a reflow method or the like which involves heating, it is possible to suppress generation of outgas. In this way, it is possible to reliably suppress a decrease in the quality of the piezoelectric vibrator 1 when mounting the piezoelectric vibrator 1.

(Oscillator)

Figure 15:
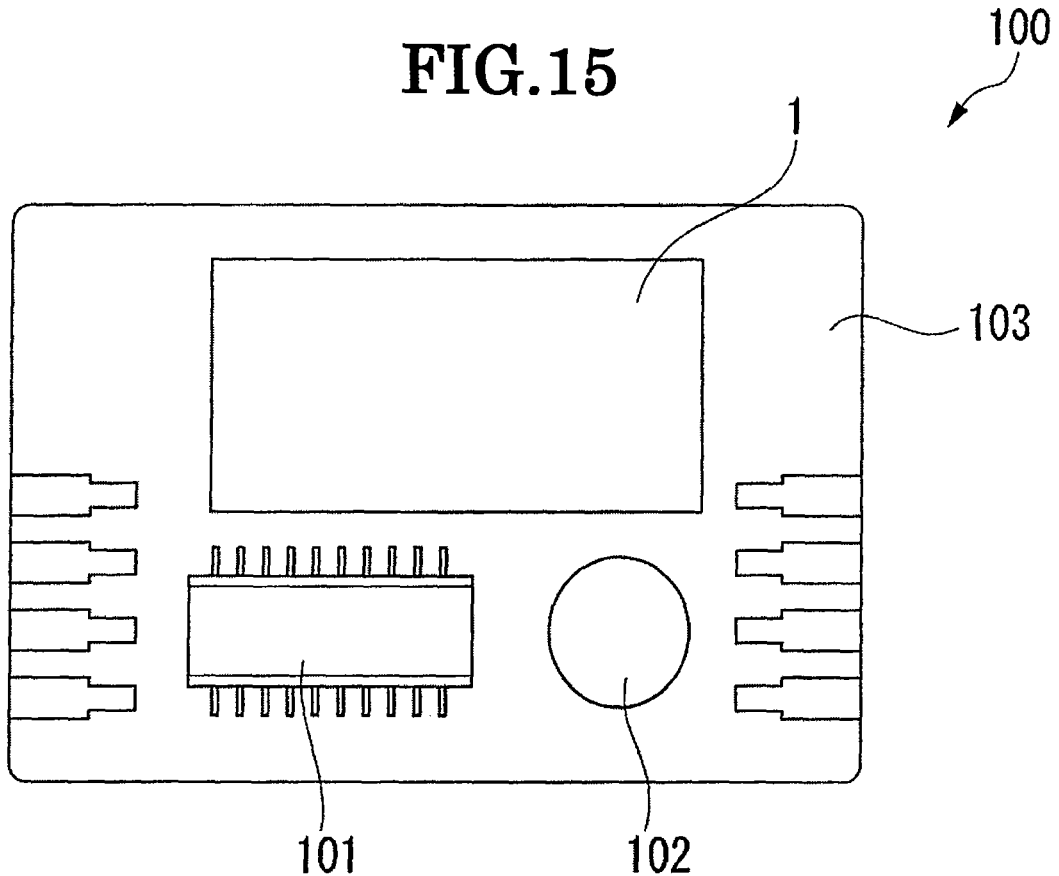
FIG. 15 is a view showing the configuration of an oscillator according to an embodiment of the invention.

Next, an embodiment of an oscillator according to the invention will be described with reference to FIG. 15. FIG. 15 is a diagram showing a configuration of an oscillator having the piezoelectric vibrator 1.

As shown in FIG. 15, an oscillator 100 according to the present embodiment is one in which the piezoelectric vibrator 1 is configured as an oscillating piece electrically connected to an integrated circuit 101. The oscillator 100 includes a substrate 103 on which an electronic component 102, such as a capacitor, is mounted. The integrated circuit 101 for an oscillator is mounted on the substrate 103, and the piezoelectric vibrator 1 is mounted near the integrated circuit 101. The electronic component 102, the integrated circuit 101, and the piezoelectric vibrator 1 are electrically connected to each other by a wiring pattern (not shown). In addition, each of the constituent components is molded with a resin (not shown).

In the oscillator 100 configured as described above, when a voltage is applied to the piezoelectric vibrator 1, the piezoelectric vibrating reed 4 in the piezoelectric vibrator 1 vibrates. This vibration is converted into an electrical signal due to the piezoelectric property of the piezoelectric vibrating reed 4 and is then input to the integrated circuit 101 as the electrical signal. The input electrical signal is subjected to various kinds of processing by the integrated circuit 101 and is then output as a frequency signal. In this way, the piezoelectric vibrator 1 functions as an oscillating piece.

Moreover, by selectively setting the configuration of the integrated circuit 101, for example, an RTC (Real Time Clock) module, according to demand, it is possible to add a function of controlling the operation date or time of the corresponding device or an external device or of providing the time or calendar in addition to a single functional oscillator for a clock.

As described above, according to the oscillator 100 of the present embodiment, since the oscillator 100 includes the piezoelectric vibrator 1 which can be manufactured at a low cost and with a high quality, the oscillator 100 itself can be manufactured at a low cost and with a high quality.

(Electronic Device)

Figure 16:
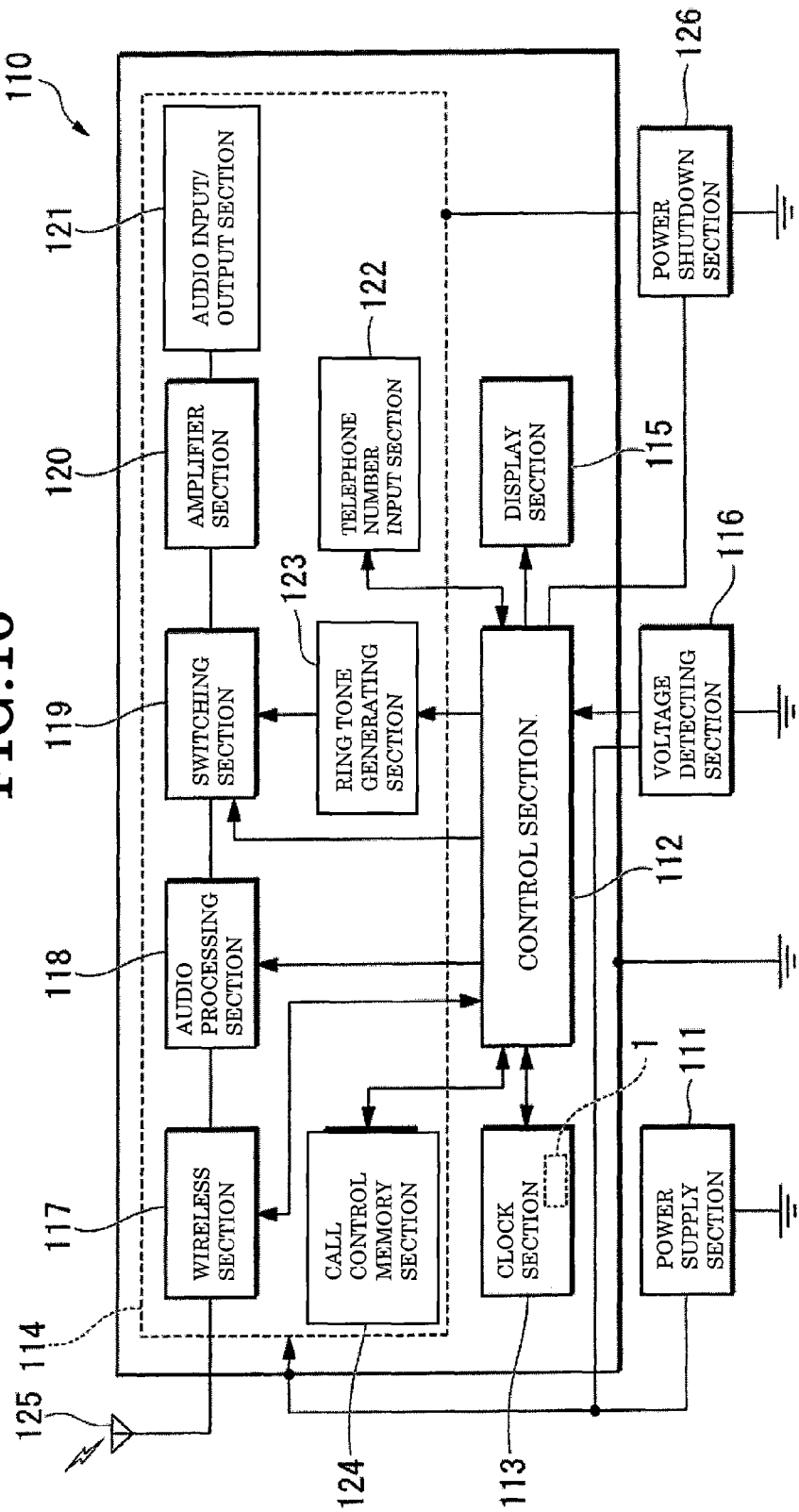
FIG. 16 is a view showing the configuration of an electronic device according to an embodiment of the invention.

Next, an embodiment of an electronic device according to the invention will be described with reference to FIG. 16. In addition, a portable information device including the piezoelectric vibrator 1 will be described as an example of an electronic device. The portable information device 110 according to the present embodiment is represented by a mobile phone, for example, and has been developed and improved from a wristwatch in the related art. The portable information device 110 is similar to a wristwatch in external appearance, and a liquid crystal display is disposed in a portion equivalent to a dial pad so that a current time and the like can be displayed on this screen. Moreover, when it is used as a communication apparatus, it is possible to remove it from the wrist and to perform the same communication as a mobile phone in the related art with a speaker and a microphone built in an inner portion of the band. However, the portable information device 110 is very small and light compared with a mobile phone in the related art.

Next, the configuration of the portable information device 110 according to the present embodiment will be described. As shown in FIG. 16, the portable information device (electronic device) 110 includes the piezoelectric vibrator 1 and a power supply section 111 for supplying power. The power supply section 111 is formed of a lithium secondary battery, for example. A control section 112 which performs various kinds of control, a clock section 113 which performs counting of time and the like, a communication section 114 which performs communication with the outside, a display section 115 which displays various kinds of information, and a voltage detecting section 116 which detects the voltage of each functional section are connected in parallel to the power supply section 111. In addition, the power supply section 111 supplies power to each functional section.

The control section 112 controls an operation of the entire system. For example, the control section 112 controls each functional section to transmit and receive the audio data or to measure or display a current time. In addition, the control section 112 includes a ROM in which a program is written in advance, a CPU which reads and executes a program written in the ROM, a RAM used as a work area of the CPU, and the like.

The clock section 113 includes an integrated circuit, which has an oscillation circuit, a register circuit, a counter circuit, and an interface circuit therein, and the piezoelectric vibrator 1. When a voltage is applied to the piezoelectric vibrator 1, the piezoelectric vibrating reed 4 vibrates, and this vibration is converted into an electrical signal due to the piezoelectric property of the piezoelectric vibrating reed 4 and is then input to the oscillation circuit as the electrical signal. The output of the oscillation circuit is binarized to be counted by the register circuit and the counter circuit. Then, a signal is transmitted to or received from the control section 112 through the interface circuit, and current time, current date, calendar information, and the like are displayed on the display section 115.

The communication section 114 has the same function as a mobile phone in the related art, and includes a wireless section 117, an audio processing section 118, a switching section 119, an amplifier section 120, an audio input/output section 121, a telephone number input section 122, a ring tone generating section 123, and a call control memory section 124.

The wireless section 117 transmits/receives various kinds of data, such as audio data, to/from the base station through an antenna 125. The audio processing section 118 encodes and decodes an audio signal input from the wireless section 117 or the amplifier section 120. The amplifier section 120 amplifies a signal input from the audio processing section 118 or the audio input/output section 121 up to a predetermined level. The audio input/output section 121 is formed by a speaker, a microphone, and the like, and amplifies a ring tone or incoming sound or collects the sound.

In addition, the ring tone generating section 123 generates a ring tone in response to a call from the base station. The switching section 119 switches the amplifier section 120, which is connected to the audio processing section 118, to the ring tone generating section 123 only when a call arrives, so that the ring tone generated in the ring tone generating section 123 is output to the audio input/output section 121 through the amplifier section 120.

In addition, the call control memory section 124 stores a program related to incoming and outgoing call control for communications. Moreover, the telephone number input section 122 includes, for example, numeric keys from 0 to 9 and other keys. The user inputs a telephone number of a communication destination and the like by pressing these numeric keys and the like.

The voltage detecting section 116 detects a voltage drop when a voltage, which is applied from the power supply section 111 to each functional section, such as the control section 112, drops below the predetermined value, and notifies the control section 112 of the detection of the voltage drop. In this case, the predetermined voltage value is a value which is set beforehand as the lowest voltage necessary to operate the communication section 114 stably. For example, it is about 3 V. When the voltage drop is notified from the voltage detecting section 116, the control section 112 disables the operation of the wireless section 117, the audio processing section 118, the switching section 119, and the ring tone generating section 123. In particular, the operation of the wireless section 117 that consumes a large amount of power should be necessarily stopped. In addition, a message informing the user that the communication section 114 is not available due to insufficient battery power is displayed on the display section 115.

That is, it is possible to disable the operation of the communication section 114 and display the notice on the display section 115 by the voltage detecting section 116 and the control section 112. This message may be a character message. Or as a more intuitive indication, a cross mark (X) may be displayed on a telephone icon displayed at the top of the display screen of the display section 115.

In addition, the function of the communication section 114 can be more reliably stopped by providing a power shutdown section 126 capable of selectively shutting down the power to a section related to the function of the communication section 114.

As described above, according to the portable information device 110 of the present embodiment, since the portable information device 110 includes the piezoelectric vibrator 1 which can be manufactured at a low cost and with a high quality, the portable information device 110 itself can be manufactured at a low cost and with a high quality.

(Radio-Controlled Timepiece)

Figure 17:
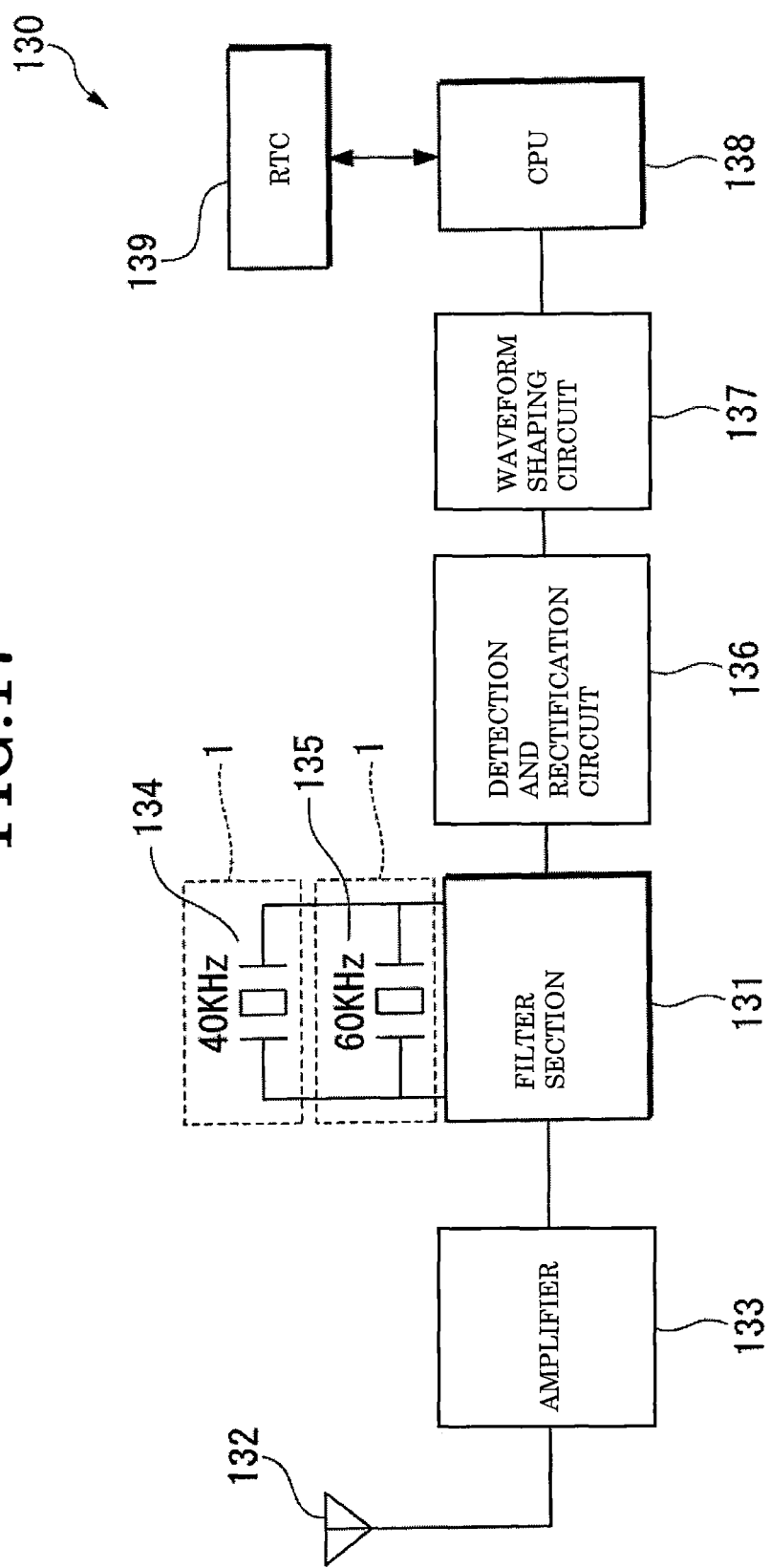
FIG. 17 is a view showing the configuration of a radio-controlled timepiece according to an embodiment of the invention.

Next, a radio-controlled timepiece according to still another embodiment of the invention will be described with reference to FIG. 17. FIG. 17 is a diagram showing a configuration of a radio-controlled timepiece having the piezoelectric vibrator 1 described above.

As shown in FIG. 17, a radio-controlled timepiece 130 according to the present embodiment includes the piezoelectric vibrators 1 electrically connected to a filter section 131. The radio-controlled timepiece 130 is a clock with a function of receiving a standard radio wave including the clock information, automatically changing it to the correct time, and displaying the correct time.

In Japan, there are transmission centers (transmission stations) that transmit a standard radio wave in Fukushima Prefecture (40 kHz) and Saga Prefecture (60 kHz), and each center transmits the standard radio wave. A long wave with a frequency of, for example, 40 kHz or 60 kHz has both a characteristic of propagating along the land surface and a characteristic of propagating while being reflected between the ionosphere and the land surface, and therefore has a propagation range wide enough to cover the entire area in Japan through the two transmission centers.

The functional configuration of the radio-controlled timepiece 130 will be described with reference to FIG. 17.

An antenna 132 receives a long standard radio wave with a frequency of 40 kHz or 60 kHz. The long standard radio wave is obtained by performing AM modulation of the time information, which is called a time code, using a carrier wave with a frequency of 40 kHz or 60 kHz. The received long standard wave is amplified by an amplifier 133 and is then filtered and synchronized by the filter section 131 having the plurality of piezoelectric vibrators 1.

In the present embodiment, the piezoelectric vibrators 1 include piezoelectric vibrator sections 134 and 135 having resonance frequencies of 40 kHz and 60 kHz, respectively, which are the same frequencies as the carrier frequency.

In addition, the filtered signal with a predetermined frequency is detected and demodulated by a detection and rectification circuit 136. Then, the time code is extracted by a waveform shaping circuit 137 and counted by the CPU 138. The CPU 138 reads the information including the current year, the total number of days, the day of the week, the time, and the like. The read information is reflected on an RTC 139, and the correct time information is displayed.

Because the carrier wave is 40 kHz or 60 kHz, a vibrator having the tuning-fork structure described above is suitable for the piezoelectric vibrator sections 134 and 135.

Moreover, although the above explanation has been given for the case in Japan, the frequency of a long standard wave is different in other countries. For example, a standard wave of 77.5 kHz is used in Germany. Therefore, when the radio-controlled timepiece 130 which is also operable in other countries is assembled in a portable device, the piezoelectric vibrator 1 corresponding to frequencies different from the frequencies used in Japan is necessary.

As described above, according to the radio-controlled timepiece 130 of the present embodiment, since the radio-controlled timepiece 130 includes the piezoelectric vibrator 1 which can be manufactured at a low cost and with a high quality, the radio-controlled timepiece 130 itself can be manufactured at a low cost and with a high quality.

It should be noted that the technical scope of the invention is not limited to the embodiments above, and the invention can be modified in various ways without departing from the spirit of the invention.

For example, although the above-described embodiments have been described by way of an example of the grooved piezoelectric vibrating reed 4 in which the groove portions 18 are formed on both surfaces of the vibrating arms 10 and 11 as an example of the piezoelectric vibrating reed 4, the piezoelectric vibrating reed 4 may be a type of piezoelectric vibrating reed without the groove portions 18. However, since the field efficiency between the pair of the excitation electrodes 15 when a predetermined voltage is applied to the pair of excitation electrodes 15 can be increased by forming the groove portions 18, it is possible to suppress the vibration loss further and to improve the vibration properties much more. That is to say, it is possible to decrease the CI value (crystal impedance) further and to improve the performance of the piezoelectric vibrating reed 4 further. In this respect, it is preferable to form the groove portions 18.

In addition, although the embodiment has been described by way of an example of a tuning-fork type piezoelectric vibrating reed 4, the piezoelectric vibrating reed of the invention is not limited to the tuning-fork type piezoelectric vibrating reed but may be a thickness-shear type piezoelectric vibrating reed, for example.

In addition, in the embodiment, although the cavity C is formed by providing the recess portion 3a in the lid substrate 3, the invention is not limited to this, and for example, the cavity C may be formed by providing the recess portion in the base substrate 2, and the cavity C may be formed by providing the recess portions in the two substrates 2 and 3.

In addition, in the embodiment, although the bonding film 35 is formed on the base substrate 2, the invention is not limited to this, and the bonding film may be formed on the lid substrate 3, and the bonding film may be formed on the two substrates 2 and 3.

In addition, in the embodiment, although the piezoelectric vibrating reed 4 is bonded to the lead-out electrodes 36 and 37 by the gold bumps B, the invention is not limited to the gold bumps B.

In addition, in the embodiment, although the bonding temperature T in the bonding step is 300° C., the invention is not limited to this. However, the bonding temperature T is preferably equal to or higher than 300° C. In addition, when a crystal is used as the piezoelectric vibrating reed 4, the bonding temperature T is preferably at least lower than a phase transition temperature which is a transition point associated with the piezoelectric properties of a crystal.

In addition, in the embodiment, although the piezoelectric vibrator 1 is manufactured in the order of the mounting step (S40), the loading step (S45), the heating step (S50), and the depressurization step (S60), the invention is not limited to this. The loading step (S45) and the heating step (S50) may only need to be performed later than the mounting step (S40), and the depressurization step (S60) may only need to be performed later than the loading step (S45). For example, the piezoelectric vibrator may be manufactured in the order of the mounting step (S40), the heating step (S50), the loading step (S45), and the depressurization step (S60), and the piezoelectric vibrator may be manufactured in the order of the mounting step (S40), the loading step (S45), the depressurization step (S60), and the heating step (S50).

In addition, within a range not deviating from the object of the invention, constituent elements of the above-described embodiments may be appropriately substituted with well-known constituent elements, and the above-described modified examples may be appropriately combined.

What is claimed is:

1. A method for manufacturing a piezoelectric vibrator comprising:
   a package in which a first substrate and a second substrate are superimposed so as to form a cavity therebetween;
   outer electrodes which are formed on an outer surface of the first substrate;
   inner electrodes which are formed on the first substrate so as to be accommodated in the cavity;
   penetration electrodes which are formed so as to penetrate through the first substrate so that the outer electrodes and the inner electrodes are electrically connected; and
   a piezoelectric vibrating reed which is sealed in the cavity and electrically connected to the inner electrodes at the inner side of the cavity, the method comprising:
   a bonding film forming step of forming a bonding film on at least one of the first substrate and the second substrate using a low-melting-point glass so as to bond the two substrates;
   a mounting step of electrically connecting the piezoelectric vibrating reed to the inner electrodes formed on the first substrate;
   a loading step of loading the first substrate and the second substrate in a vacuum chamber of which the inner pressure can be controlled after the bonding film forming step and the mounting step are performed;
   a heating step of heating the bonding film after the bonding film forming step and the mounting step are performed;
   a depressurization step of depressurizing the inside of the vacuum chamber after the loading step is performed; and
   a bonding step of superimposing the first substrate and the second substrate onto each other at the inner side of the vacuum chamber with the bonding film disposed therebetween while heating the bonding film to a predetermined bonding temperature to thereby bond the two substrates by the bonding film after the heating step and the depressurizing step are performed,
   wherein in the heating step, the bonding film is heated to a temperature higher than the bonding temperature.

2. The method for manufacturing the piezoelectric vibrator according to claim 1,
   wherein in the mounting step, the piezoelectric vibrating reed is bump-bonded to the inner electrodes through gold bumps.

3. The method for manufacturing the piezoelectric vibrator according to claim 1,
   wherein the bonding temperature is equal to or higher than 300° C.

4. A piezoelectric vibrator comprising:
   a package in which a first substrate and a second substrate are superimposed so as to form a cavity therebetween;
   outer electrodes which are formed on an outer surface of the first substrate;
   inner electrodes which are formed on the first substrate so as to be accommodated in the cavity;
   penetration electrodes which are formed so as to penetrate through the first substrate so that the outer electrodes and the inner electrodes are electrically connected; and
   a piezoelectric vibrating reed which is sealed in the cavity and electrically connected to the inner electrodes at the inner side of the cavity,
   wherein the first substrate and the second substrate are bonded by a bonding film that is formed of a low-melting-point glass, and
   wherein the bonding film is heated to a predetermined bonding temperature when the first substrate and the second substrate are bonded together, and is formed by being heated to a temperature higher than the bonding temperature before the bonding is performed.

5. The piezoelectric vibrator according to claim 4,
   wherein the piezoelectric vibrating reed is bump-bonded to the inner electrodes through gold bumps.

6. An oscillator in which the piezoelectric vibrator according to claim 4 is electrically connected to an integrated circuit as an oscillating piece.

7. An electronic device in which the piezoelectric vibrator according to claim 4 is electrically connected to a clock section.

8. A radio-controlled timepiece in which the piezoelectric vibrator according to claim 4 is electrically connected to a filter section.

* * * * *